(12) United States Patent
Wakao et al.

(10) Patent No.: US 6,472,700 B2
(45) Date of Patent: Oct. 29, 2002

(54) SEMICONDUCTOR DEVICE WITH ISOLATION INSULATOR, INTERLAYER INSULATION FILM, AND A SIDEWALL COATING FILM

(75) Inventors: Kazutoshi Wakao, Hyogo (JP); Akinobu Teramoto, Hyogo (JP); Masahiko Fujisawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/333,653

(22) Filed: Jun. 16, 1999

(65) Prior Publication Data

US 2002/0027260 A1 Mar. 7, 2002

(30) Foreign Application Priority Data

Feb. 3, 1999 (JP) .............................................. 11-025677

(51) Int. Cl.⁷ ..................... H01L 29/792; H01L 29/788; H01L 27/115
(52) U.S. Cl. .................... 257/296; 257/900; 257/310; 257/774
(58) Field of Search ................. 257/276, 774, 257/680, 306–310, 413, 900

(56) References Cited

U.S. PATENT DOCUMENTS

| | | | | |
|---|---|---|---|---|
| 5,444,005 A | * | 8/1995 | Kim et al. | 438/636 |
| 5,828,096 A | * | 10/1998 | Ohno et al. | 257/306 |
| 5,945,738 A | * | 8/1999 | Nguyen et al. | 257/774 |
| 5,977,583 A | * | 11/1999 | Hosotani et al. | 257/311 |
| 5,990,507 A | * | 11/1999 | Mochizuki et al. | 257/295 |
| 6,020,643 A | * | 2/2000 | Fukuzumi et al. | 257/774 |
| 6,048,792 A | * | 4/2000 | Watanabe et al. | 257/774 |
| 6,069,379 A | * | 5/2000 | Kimura et al. | 257/296 |
| 6,100,592 A | * | 8/2000 | Pan | 257/774 |
| 6,140,705 A | * | 10/2000 | Liu | 257/774 |
| 6,211,557 B1 | * | 4/2001 | Ko et al. | 257/413 |
| 6,222,268 B1 | * | 4/2001 | Teranchi et al. | 257/774 |
| 6,281,562 B1 | * | 8/2001 | Segawa et al. | 257/510 |
| 6,294,460 B1 | * | 9/2001 | Subramanian et al. | 438/636 |
| 6,300,683 B1 | * | 10/2001 | Nagasaka et al. | 257/774 |

FOREIGN PATENT DOCUMENTS

| | | |
|---|---|---|
| JP | 8-115909 | 5/1996 |
| JP | 9-134954 | 5/1997 |
| JP | 10-74832 | 3/1998 |

\* cited by examiner

Primary Examiner—Alexander O. Williams
(74) Attorney, Agent, or Firm—McDermott, Will & Emery

(57) ABSTRACT

A semiconductor device capable of suppressing increase in the junction leakage current and preventing deterioration in the electric characteristics even when the device is miniaturized, and a method of manufacturing thereof are attained. The semiconductor device includes a semiconductor substrate, an isolation insulator, a gate electrode, a coating film, an interlayer insulation film, and a sidewall coating film. The semiconductor substrate has a main surface. The isolation insulator is formed at the main surface of the semiconductor substrate and isolates a conductive region. The gate electrode is formed in the conductive region. The coating film is formed on the isolation insulator, and it has a sidewall and a film thickness of at most that of the gate electrode. The interlayer insulation film is formed on the coating film. The sidewall coating film is formed on the sidewall of the coating film, and it includes a material having an etching rate different from that of the interlayer insulation film.

14 Claims, 21 Drawing Sheets

SEMICONDUCTOR DEVICE WITH ISOLATION INSULATOR, INTERLAYER INSULATION FILM, AND A SIDEWALL COATING FILM

BACKGROUND OF THE INVENTION

1. Field of the Invention

The present invention relates to semiconductor devices and methods of manufacturing thereof. More particularly, the present invention relates to a semiconductor device with an isolation insulator capable of being miniaturized and highly integrated without deterioration in the electric characteristics, and a method of manufacturing thereof.

2. Description of the Background Art

Semiconductor devices represented such as by DRAMs (Dynamic Random Access Memories) are conventionally known. FIG. 31 is a schematic cross sectional view showing a conventional semiconductor device.

Referring to FIG. 31, the semiconductor device includes a field effect transistor formed at a main surface of a semiconductor substrate 101. At the main surface of semiconductor substrate 101, an LOCOS (Local Oxidation of Silicon) isolation oxide film 129 is formed to isolate conductive regions. The source/drain regions 103a, 103b of the field effect transistors are formed in the conductive regions. In channel regions adjacent to source/drain regions 103a, 103b, gate insulation films 104a, 104b are formed on the main surface of semiconductor substrate 101. Gate electrodes 105a to 105c are formed on gate insulation films 104a, 104b and isolation oxide film 129. Gate electrode side walls 107a to 107d are formed on the side surfaces of gate electrodes 105a to 105c. An interlayer insulation film 109 is formed on gate electrodes 105a to 105c and gate electrode sidewalls 107a to 107d. In a region on source/drain regions 103a, 103b, contact holes 110a, 110b are formed in interlayer insulation film 109. In contact holes 110a, 110b and on interlayer insulation film 109, interconnections 111a, 111b are formed to electrically connect to source/drain regions 103a, 103b. A second interlayer insulation film 112 is formed on interlayer insulation film 109 and interconnections 111a, 111b.

In recent years, miniaturization and integration of semiconductor devices have increasingly been demanded. Recently, the gate length of a field effect transistor in the semiconductor device as shown in FIG. 31 has been required to be as small as about 0.18 μm. The inventors found out that problems as described below occur as semiconductors continue to be highly integrated and miniaturized. Referring to FIG. 32, the problems will be described in detail below.

FIG. 32 is a schematic cross sectional view for describing a method of manufacturing the semiconductor device shown in FIG. 31. As shown in FIG. 32, isolation oxide film 129 and source/drain regions 103a, 103b are formed at the main surface of semiconductor device 101 by a method similar to conventional methods of manufacturing a semiconductor device. Similarly, gate insulation films 104a, 104b, gate electrodes 105a to 105c, gate electrode sidewalls 107a to 107d and first interlayer insulation film 109 are formed on the main surface of semiconductor substrate 101. Then, a resist pattern 123 is formed on interlayer insulation film 109. By removing interlayer insulation film 109 through etching using resist pattern 123 as a mask, contact holes 110a, 110b are formed.

When the gate length of the field effect transistor is as fine as 0.18 μm, the positioning accuracy of contact holes 110a, 110b are required to be higher than ever. However, the positions of contact holes 10a, 110b may be shifted from their prescribed positions such as by mask alignment errors in forming resist pattern 123 and the like. As shown in FIG. 32, ends 134a, 134b of isolation oxide film 129 may be removed during etching for forming contact holes 110a, 110b.

After the step shown in FIG. 32, resist pattern 123 is removed. Then, interconnections 111a, 111b (see FIG. 33) formed of doped polysilicon, for example, are formed in contact holes 110a, 110b and on first interlayer insulation film 109. By forming second interlayer insulation film 112 (see FIG. 33) on interconnections 111a, 111b and first interlayer insulation film 109, the semiconductor device as shown in FIG. 33 can be obtained. Here, FIG. 33 is a schematic cross sectional view showing the semiconductor device manufactured by the manufacturing method shown in FIG. 32.

Referring to FIG. 33, the ends of isolation oxide film 129 are partially removed during etching for forming contact holes 110a, 110b, and the width W of isolation oxide film 129 is made smaller than a designed value. Here, a parasitic transistor is formed of which gate electrode is gate electrode 105c, which gate insulation film is isolation oxide film 129, and which source/drain regions are source/drain regions 103a, 103b. The width of isolation oxide film 129 corresponds to the gate length of the parasitic transistor. Since the gate length is made smaller than a desired value, the threshold voltage of the parasitic transistor becomes lower than a designed value. Accordingly, a junction leakage current in this semiconductor device becomes undesirably larger than a designed value. A large junction leakage current causes a malfunction of a semiconductor device circuit as an example, a cause of deteriorating the electric characteristics of a semiconductor device. These problems have become serious as semiconductor devices continue to be miniaturized and integrated.

SUMMARY OF THE INVENTION

One object of the present invention is to provide a semiconductor device capable of suppressing increase in the junction leakage current and preventing deterioration in the electric characteristics even when the device is miniaturized.

Another object of the present invention is to provide a method of manufacturing a semiconductor device capable of suppressing increase in the junction leakage current and preventing deterioration in the electric characteristics even when the device is miniaturized.

A semiconductor device according to a first aspect of the present invention includes a semiconductor substrate, an isolation insulator, a gate electrode, a coating film, an interlayer insulation film, and a sidewall coating film. The semiconductor substrate has a main surface. The isolation insulator is formed at the main surface of the semiconductor substrate and isolates a conductive region. The gate electrode is formed in the conductive region. The coating film is formed on the isolation insulator, has a sidewall, and has a film thickness of at most that of the gate electrode. The interlayer insulation film is formed on the coating film. The sidewall coating film is formed on the sidewall of the coating film and includes a material having an etching rate different from that of the interlayer insulation film.

Accordingly, even when a contact hole is to be formed in a region adjacent to the sidewall coating film by removing part of the interlayer insulation film, the sidewall coating film serves as a protection film for preventing damage to the isolation insulator by etching. Thus, even if the position of a mask for etching is varied in the step of forming the contact hole, damage to the isolation insulator by etching can be prevented. As a result, removal of part of the isolation insulator by etching can be prevented, which can prevent reduction in the width of the isolation insulator. Thus, increase in the junction leakage current in the semiconductor device, which is due to reduction in the width of the isolation insulator, can be prevented. Therefore, deterioration in the electric characteristics of a semiconductor device, which is due to increase in the junction leakage current, can be prevented.

If the sidewall of the contact hole has its bottom partially including the sidewall coating film, the bottom area of the contact hole can be changed by changing the film thickness of the sidewall coating film. The film thickness of the sidewall coating film can be changed by changing the height of the coating film sidewall, which is brought out by changing the film thickness of the coating film. As a result, the bottom area of the contact hole can be changed arbitrarily by changing the film thickness of the coating film.

Since the film thickness of the sidewall coating film can be changed even by changing an angle formed by the sidewall of the coating film and the main surface of the semiconductor substrate, the bottom area of the contact hole can be changed arbitrarily similarly to the above case.

Since the coating film is formed on the isolation insulator, the planarity of the upper surface of the interlayer insulation film can be improved compared with a case where the coating film is not formed, even when the interlayer insulation film is to be formed to extend from the coating film to the gate electrode. As a result, a step portion can be prevented from being formed at the upper surface of the interlayer insulation film due to existence of the gate electrode. Thus, interconnections and the like formed on the interlayer insulation film can be prevented from being disconnected due to the step portion.

In the semiconductor device according to the first aspect, it is preferred that the angle formed by the sidewall of the coating film and the main surface of the semiconductor substrate is at least 60° and at most 90°.

In this case, the sidewall coating film can be formed reliably.

In the semiconductor device according to the first aspect, it is preferred that the distance between the main surface of the semiconductor substrate and the upper surface of the coating film is at least 50 nm and at most 100 nm.

In this case, especially in the semiconductor device including a minute field effect transistor with a gate length of approximately 0.18 $\mu$m, the sidewall coating film can be formed reliably and the planarity of the upper surface of the interlayer insulation film can be improved.

In the semiconductor device according to the first aspect, the isolation insulator may include an insulation film that is filled in a trench formed at the main surface of the semiconductor substrate.

In the semiconductor device according to the first aspect, the isolation insulator may include an oxide film that is formed by thermally oxidizing the main surface of the semiconductor substrate.

In the semiconductor device according to the first aspect, the conductive region may include a silicide layer.

In this case, the coating film can be used as a mask for forming the silicide layer as described in the method of manufacturing a semiconductor device below. Even when the coating film is to be formed, therefore, increase in the number of manufacturing steps can be suppressed. As a result, increase in the manufacturing cost of a semiconductor device can be prevented.

A semiconductor device according to a second aspect of the present invention includes a semiconductor substrate, an isolation insulator, an interlayer insulation film, and a sidewall coating film. The semiconductor substrate has a main surface. The isolation insulator is formed at the main surface of the semiconductor substrate, has a sidewall, and isolates a conductive region. The interlayer insulation film is formed on the isolation insulator. The sidewall coating film is formed on the sidewall of the isolation insulator and includes a material having an etching rate different from that of the interlayer insulation film. The isolation insulator includes upper and lower insulators. The upper insulator is placed over the main surface of the semiconductor substrate and has the sidewall. The lower insulator connects to the upper insulator and is placed under the main surface of the semiconductor substrate. The film thickness of the upper insulator is at least that of the lower insulator.

Accordingly, even when a contact hole is to be formed in a region adjacent to the sidewall coating film by removing part of the interlayer insulation film, the sidewall coating film selves as a protection film for preventing damage to the isolation insulator by etching. Thus, even if the position of a mask for etching is varied in the step of forming the contact hole, damage to the isolation insulator by etching can be prevented. As a result, removal of part of the isolation insulator by etching can be prevented, which can prevent reduction in the width of the isolation insulator. Thus, increase in the junction leakage current in the semiconductor device, which is due to reduction in the width of the isolation insulator, can be prevented. Therefore, deterioration in the electric characteristics of the semiconductor device, which is due to increase in the junction leakage current, can be prevented.

Since the film thickness of the upper insulator is at least that of the lower insulator, the sidewall coating film can be formed easily on the sidewall of the upper insulator.

If the sidewall of the contact hole has its bottom partially including the sidewall coating film, the bottom area of the contact hole can be changed by changing the film thickness of the sidewall coating film. The film thickness of the sidewall coating film can be changed by changing the height of the upper surface of the upper insulator, which is brought about by changing the film thickness of the upper insulator. As a result, the bottom area of the contact hole can be changed arbitrarily by changing the film thickness of the upper insulator.

Since the film thickness of the sidewall coating film can be changed even by changing an angle formed by the sidewall of the upper insulator and the main surface of the semiconductor substrate, the bottom area of the contact hole can be changed arbitrarily similarly to the above case.

In the semiconductor device according to the first or second aspect, the sidewall coating film may include a silicon nitride film.

In this case, the sidewall coating film includes a silicon nitride film having an etching rate different from that of a silicon oxide film that is generally used as an interlayer insulation film. Accordingly, the isolation insulator can be protected reliably by the sidewall coating film even during etching for forming a contact hole.

In the semiconductor device according to the first or second aspect, the sidewall coating film may include non-doped silicate glass.

In this case, the sidewall coating film includes non-doped silicate glass having an etching rate different from that of a silicon oxide film that is generally used as a interlayer insulation film. Accordingly, damage to the isolation insulator during etching for forming a contact hole can be prevented more reliably.

In the semiconductor device according to the first or second aspect, the sidewall coating film may include a low pressure TEOS oxide film.

In this case, the sidewall coating film includes a low pressure TEOS (low-pressure Tetra Ethyl Ortho Silicate) oxide film having an etching rate different from that of a silicon oxide film that is generally used as an interlayer insulation film, damage to the isolation insulator by etching can be prevented more reliably.

In a method of manufacturing a semiconductor device according to a third aspect of the present invention, an isolation insulator for isolating a conductive region is formed at a main surface of a semiconductor substrate. In the conductive region, a gate electrode is formed on the main surface of the semiconductor substrate. On the isolation insulator, a coating film is formed which has a sidewall and a film thickness of at most that of the gate electrode. A sidewall coating film is formed on the sidewall of the coating film.

Accordingly, a semiconductor device having a sidewall coating film can be formed easily.

Even when a contact hole is to be formed in a region adjacent to the sidewall coating film by forming an interlayer insulation film on the conductive region and removing part of the interlayer insulation film, the sidewall coating film can be used as a protection film for protecting the isolation insulator. Thus, partial removal of the isolation insulator by etching can be prevented. As a result, increase in the junction leakage current, which is due to partial removal of the isolation insulator, can be prevented. Therefore, deterioration in the electric characteristics of the semiconductor device can be prevented.

In the method of manufacturing a semiconductor device according to the third aspect, the step of forming the isolation insulator may include forming a resist pattern on the semiconductor substrate, forming a trench at the main surface of the semiconductor substrate by removing part of the main surface of the semiconductor substrate using the resist pattern as a mask, and filling an insulation film in the trench.

In the method of manufacturing a semiconductor device according to the third aspect, the step of forming the isolation insulator may include forming an antioxidant film on a region to be a conductive region, and thermally oxidizing the main surface of the semiconductor substrate in a region other than the region where the antioxidant film is formed.

The method of manufacturing a semiconductor device according to the third aspect of the present invention may include the step of forming a silicide layer in the conductive region using the coating film as a mask.

In this case, the coating film is used as a mask and there is no need to separately prepare a mask for forming the silicide layer. As a result, the number of manufacturing steps of a semiconductor device can be reduced compared with a case where a mask is separately prepared.

In the method of manufacturing a semiconductor device according to the third aspect, the gate electrode may have a side surface, and the step of forming the sidewall coating film may include forming a sidewall insulation film on the side surface of the gate electrode.

In this case, the sidewall insulation film and the sidewall coating film can be formed simultaneously and the number of manufacturing steps of a semiconductor device can be reduced.

In a method of manufacturing a semiconductor device according to a fourth aspect of the present invention, an isolation insulator isolating a conductive region and having a sidewall is formed at a main surface of semiconductor substrate. A sidewall coating film is formed on the sidewall of the isolation insulator. The isolation insulator includes upper and lower insulators. The upper insulator is placed over the main surface of the semiconductor substrate and has the sidewall. The lower insulator connects to the upper insulator and is placed under the main surface of the semiconductor substrate. The film thickness of the upper insulator is at least that of the lower insulator.

Accordingly, a semiconductor device that has an isolation insulator including a sidewall coating film can be formed easily.

Even when a contact hole is to be formed in a region adjacent to the sidewall coating film by forming an interlayer insulation film on the conductive region and removing part of the interlayer insulation film through etching, the sidewall coating film can be used as a protection film for the isolation insulator during etching. Thus, partial removal of the isolation insulator by etching can be prevented. As a result, increase in the junction leakage current in the semiconductor device, which is due to partial removal of the isolation insulator, can be prevented. Therefore, deterioration in the electric characteristics of the semiconductor device can be prevented.

The method of manufacturing a semiconductor device according to the fourth aspect may include, prior to the step of forming the isolation insulator, the processing step of making the main surface of the semiconductor substrate in a region where the conductive region is formed lower than the main surface of the semiconductor device in a region where the isolation insulator is formed.

In this case, the main surface of the semiconductor substrate in the region where the isolation insulator is formed can be made higher than the main surface of the semiconductor substrate in the region where the conductive region is formed in the step of forming the isolation insulator. Thus, the film thickness of the upper insulator of the isolation insulator can reliably be made to have the film thickness of at least that of the lower insulator.

Further, an angle formed by the main surface of the semiconductor substrate and the sidewall of a step portion between the region where the isolation insulator is formed and the region where the conductive region is formed can be changed in the processing step. When the isolation insulator is to be formed by thermally oxidizing the main surface of the semiconductor substrate, change in the angle formed by the sidewall of the step portion and the main surface of the semiconductor substrate also changes an angle formed by the sidewall of the isolation insulator and the main surface of the semiconductor substrate. As a result, the angle formed by the sidewall of the isolation insulator and the main surface of the semiconductor substrate can be change easily.

The method of manufacturing a semiconductor device according to the fourth aspect may further include the step of forming a gate electrode having a side surface in the conductive region. The step of forming the sidewall coating film may include forming a sidewall insulation film on the side surface of the gate electrode.

In this case, the sidewall insulation film can be formed simultaneously with the sidewall coating film, and increase in the number of manufacturing steps of a semiconductor device can be prevented. Thus, increase in the manufacturing cost of a semiconductor device can also be prevented.

In the method of manufacturing a semiconductor device according to the third or fourth aspect, the sidewall coating film may include a silicon nitride film.

In this case, the sidewall coating film includes a silicon nitride film having an etching rate different from that of a silicon oxide film that is generally used as an interlayer insulation film. Thus, the sidewall coating film serves as a protection film for the isolation insulator even during etching for forming a contact hole in the interlayer insulation film. As a result, damage to the isolation insulator by etching can be prevented reliably.

In the method of manufacturing semiconductor device according to the third or fourth aspect, the sidewall coating film may include non-doped silicate glass.

In this case, non-doped silicate glass of which etching rate is different from that of a silicon oxide film used as an interlayer insulation film more than it is from that of a silicon nitride film is used as the sidewall coating film. Thus, damage to the isolation insulator by etching can be prevented more reliably.

In the method of manufacturing a semiconductor device according to the third or fourth aspect, the sidewall coating film may include a low pressure TEOS oxide film.

In this case, the low pressure TEOS oxide film of which etching rate is different from that of a silicon oxide film used as an interlayer insulation film more than it is from that of a silicon nitride film is used as the sidewall coating film. Thus, damage to the isolation insulator by etching can be prevented more reliably during etching for forming a contact hole.

In a method of manufacturing a semiconductor device according to a fifth aspect of the present invention, an isolation insulator isolating a conductive region and having a sidewall is formed at a main surface of a semiconductor substrate. A gate electrode having a side surface is formed in the conductive region. A sidewall coating film is formed on the sidewall of the isolation insulator. The step of forming the sidewall coating film includes forming a sidewall insulation film on the side surface of the gate electrode.

Accordingly, the sidewall insulation film can be formed simultaneously with the sidewall coating film, and increase in the number of manufacturing steps of a semiconductor device can be prevented. Therefore, increase in the manufacturing cost of a semiconductor device can also be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described with reference to the drawings.

First Embodiment

Figure 1:
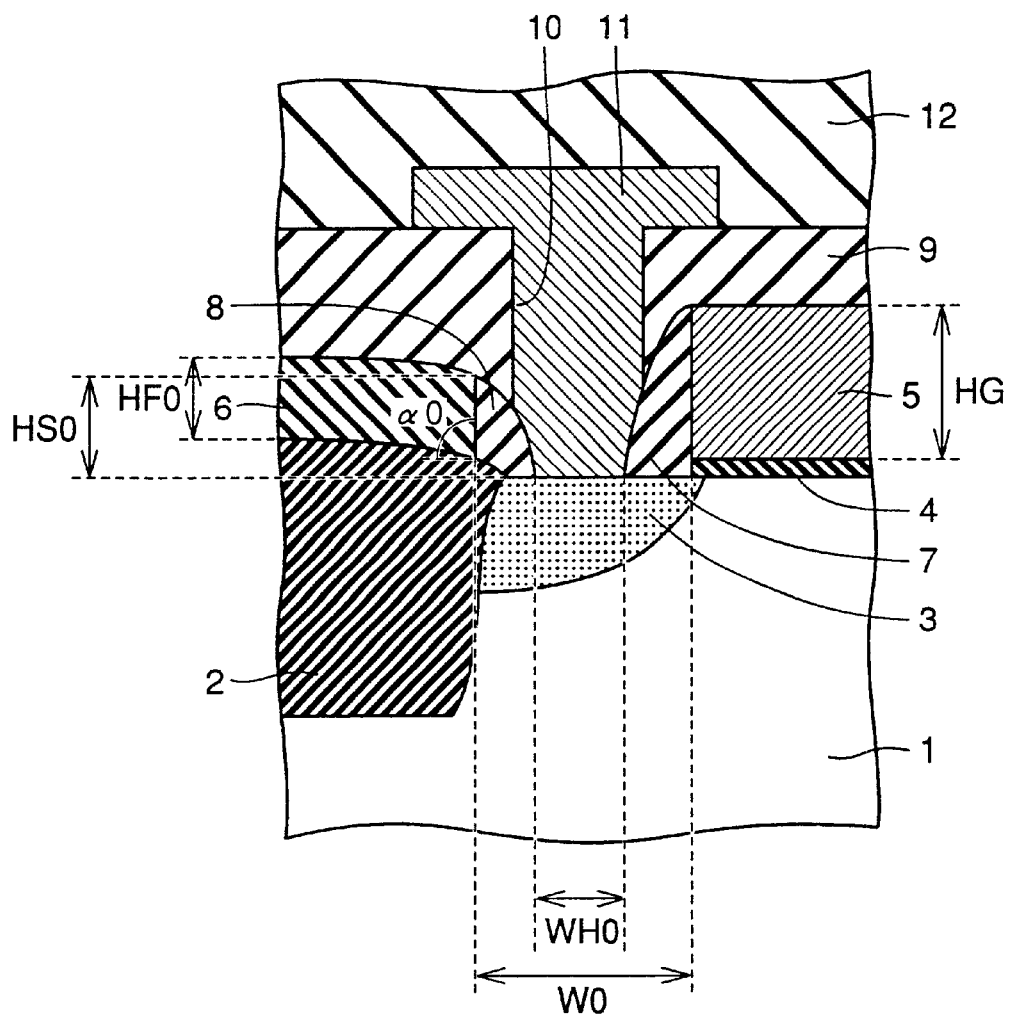
FIG. 1 is a schematic cross sectional view showing a semiconductor device in a first embodiment of the present invention.

Referring to FIG. 1, a semiconductor device will be described.

Referring to FIG. 1, the semiconductor device includes a field effect transistor that is formed in a conductive region isolated by a trench isolation oxide film 2 and an interconnection 11 that is electrically connected to a source/drain region 3 of the field effect transistor. Trench isolation oxide film 2 is formed at a main surface of a semiconductor substrate 1. In the conductive region of semiconductor substrate 1 isolated by trench isolation oxide film 2, source/drain region 3 is formed at the main surface of semiconductor substrate 1. On a channel region adjacent to source/ drain region 3, a gate electrode 5 with a film thickness of HG is formed on the main surface of semiconductor substrate 1 with a gate insulation film 4 therebetween. A gate electrode sidewall 7 formed of a silicon nitride film is formed on a side surface of gate electrode 5. The gate length of the field effect transistor is approximately 0.18 μm.

A coating insulation film 6 as a coating film is formed on trench isolation oxide film 2. The angle α0 formed by the side surface of coating insulation film 6 and the main surface of semiconductor substrate 1 is at least 60° and at most 90°. The film thickness HF0 of the coating insulation film is approximately 50 nm. An insulation oxide film sidewall 8 formed of a silicon nitride film as a sidewall coating film is formed on a side surface of coating insulation film 6. A first interlayer insulation film 9 formed of a silicon oxide film is formed on coating insulation film 6 and gate electrode 5. In a region on source/drain region 3, a contact hole 10 is formed by removing part of interlayer insulation film 9. On interlayer insulation film 9 and in contact hole 10, an interconnection 11 is formed to electrically connect to source/drain region 3. A second interlayer insulation film 12 is formed on interlayer insulation film 9 and interconnection 11.

Here, isolation oxide film sidewall 8 is formed of a silicon nitride film having an etching rate different from that of interlayer insulation film 9. Accordingly, isolation oxide film sidewall 8 serves as a protection film for isolation oxide film 2 in the etching step for removing part of interlayer insulation film 9 for forming contact hole 10. Thus, even if the position of contact hole 10 is varied, damage to trench isolation oxide film 2 by etching can be prevented reliably. As a result, partial removal of trench isolation oxide film 2 by etching can be prevented. Thus, increase in the junction leakage current in the semiconductor device can be prevented effectively. As a result, deterioration in the electric characteristics of the semiconductor device can be prevented.

Further, the height HS0 from the main surface of semiconductor substrate 1 to the upper surface of coating insulation film 6 at the sidewall portion can be changed by changing the film thickness HF0 of coating insulation film 6. As a result, the film thickness of isolation oxide film sidewall 8 can be adjusted. By thus adjusting the film thickness of isolation oxide film sidewall 8, the diameter WH0 of the contact plane between interconnection 11 and source/drain region 3 on the bottom surface of contact hole 10 can be changed without changing the distance W0 between gate electrode 5 and coating insulation film 6 and the diameter of contact hole 10 at the upper portion.

The film thickness of isolation oxide film sidewall 8 can also be adjusted by adjusting the angle α0 formed by the side surface of coating insulation film 6 and the main surface of semiconductor substrate 1. As a result, the diameter WH0 of the contact plane between interconnection 11 and source/drain region 3 can be changed.

Since coating insulation film 6 is formed which has the film thickness HF0 of at most the film thickness HG of the gate electrode, such a height difference can be made smaller that is between the upper surface of interlayer insulation film 9 in a region on trench isolation oxide film 2 and the upper surface of interlayer insulation film 9 in a region on gate electrode 5. Accordingly, the planarity of the upper surface of interlayer insulation film 9 can be improved compared with a case where coating insulation film 6 is not formed. As a result, formation of a step portion due to existence of gate electrode 5 can be suppressed at the upper surface of interlayer insulation film 9. Thus, interconnection 11 and the like formed on interlayer insulation film 9 can be prevented from being disconnected due to the step portion.

Since the angle α0 formed between the side surface of coating insulation film 6 and the main surface of semiconductor substrate 1 is at least 60° and at most 90°, isolation oxide film sidewall 8 can be formed reliably in the manufacturing step described below.

Since the film thickness HF0 of coating insulation film 6 is approximately 50 nm as described above, isolation oxide film sidewall 8 can be formed reliably and the planarity of the upper surface of interlayer insulation film 9 can be improved in the semiconductor device, as shown in FIG. 1, that includes a minute field effect transistor with a gate length of approximately 0.18 μm.

Figure 2:
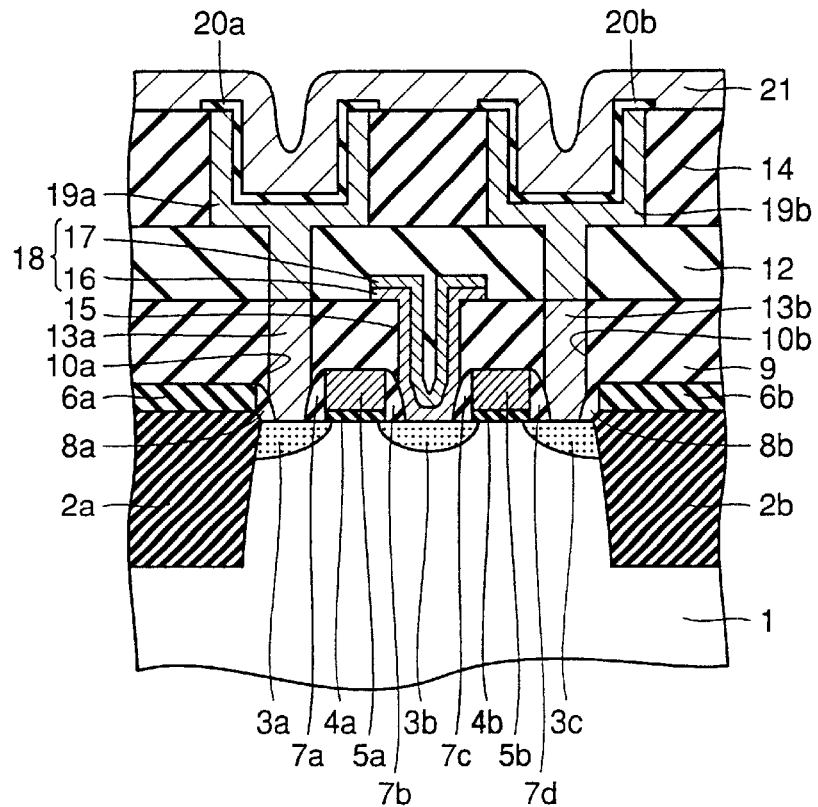
FIG. 2 is a schematic cross sectional view showing one example of the semiconductor device in the first embodiment.

Referring to FIG. 2, the semiconductor device is a semiconductor memory device including a field effect transistor, a bit line 18, and a capacitor.

Referring to FIG. 2, trench isolation oxide films 2a, 2b are formed at the main surface of semiconductor substrate 1 to surround a conductive region. In the conductive region, source/drain regions 3a to 3c are formed at the main surface of semiconductor substrate 1 to be adjacent to channel regions. In a region on the channel regions, gate electrodes 5a, 5b are formed on the main surface of semiconductor substrate 1 with gate insulation films 4a, 4b therebetween. Gate electrode sidewalls 7a to 7d are formed on the side surfaces of gate electrodes 5a, 5b. Coating insulation films 6a, 6b as a coating film are formed on trench isolation oxide films 2a, 2b. Isolation oxide film sidewalls 8a, 8b as a sidewall coating film are formed on the side surfaces of coating insulation films 6a, 6b. A first interlayer insulation film 9 is formed on gate electrodes 5a, 5band coating insulation films 6a, 6b. In a region on source/drain region 3b, a contact hole 15 is formed by removing part of interlayer insulation film 9. A doped polysilicon film 16 is formed in contact hole 15 and on the upper surface of interlayer insulation film 9. A tungsten silicide film 17 is formed on doped polysilicon film 16. Doped polysilicon film 16 and tungsten silicide film 17 constitute bit line 18. A second interlayer insulation film 12 is formed on bit line 18 and first interlayer insulation film 9. A third interlayer insulation film 14 is formed on second interlayer insulation film 12. In regions on source/drain regions 3a, 3c, contact holes 10a, 10b are formed by removing part of interlayer insulation films 9, 12, 14. At the lower portions of contact holes 10a, 10b, tungsten plugs 13a, 13b are formed to electrically connect to source/drain regions 3a, 3c. Capacitor lower electrodes 19a, 19b formed of doped polysilicon are formed on tungsten plugs 13a, 13b. Dielectric films 20a, 20b are formed on capacitor lower electrodes 19a, 19b. A capacitor upper electrode 21 is formed on dielectric films 20a, 20b.

Since isolation oxide film sidewalls 8a, 8b formed of a silicon nitride film are formed, isolation oxide film sidewalls 8a, 8b serve as protection films for trench isolation oxide films 2a, 2b in the etching step for forming contact holes 10a, 10b. Accordingly, partial removal of trench isolation oxide films 2a, 2b by etching can be prevented. As a result, increase in the junction leakage current in the semiconductor device can be prevented effectively. Since a malfunction, for example, of the semiconductor memory device due to the junction leakage current can be prevented, deterioration in the electric characteristics of the semiconductor device can be prevented. Further, similar effects to those of the semiconductor device shown in FIG. 1 can be obtained.

Referring to FIGS. 3 to 7, a method of manufacturing the semiconductor device will be described.

Figure 3:
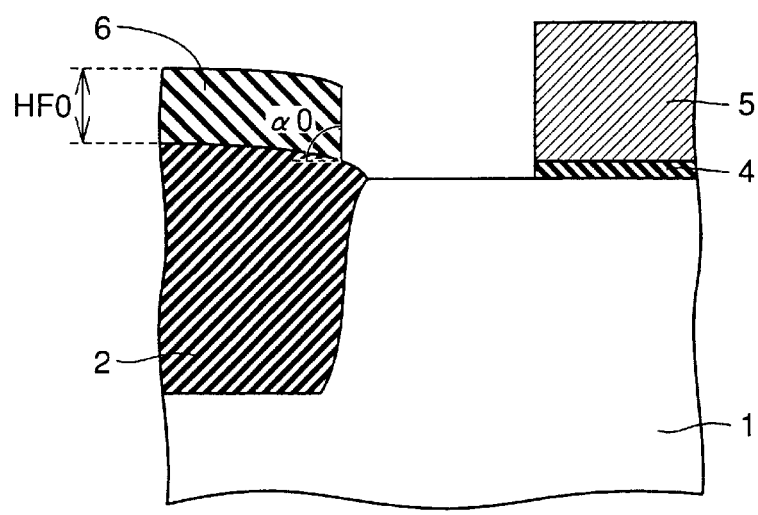
FIGS. 3 to 7 are schematic cross sectional views for describing the first to fifth steps of a method of manufacturing the semiconductor device shown in FIG. 1.

First, a silicon nitride film (not shown) is formed on a region to be a conductive region of semiconductor substrate 1 (see FIG. 3). A trench is formed by removing part of the main surface of semiconductor substrate 1 through etching using the silicon nitride film as a mask. An insulation film such a silicon oxide film is filled in the trench. Then, the insulation film on the silicon nitride film is removed by CMP (Chemical Mechanical Polishing). Trench isolation oxide film 2 (see FIG. 3) can be formed in this manner. Thereafter, gate insulation film 4 (see FIG. 3) and gate electrode 5 (see FIG. 3) of a field effect transistor are formed in the conductive region of semiconductor substrate 1.

Then, a silicon oxide film (not shown) to be coating insulation film 6 (see FIG. 3) is deposited on trench isolation oxide film 2 and the main surface of semiconductor substrate 1. A resist pattern (not shown) is formed on the silicon oxide film. The silicon oxide film is removed by etching using the resist pattern as a mask. Thereafter, the resist pattern is removed. Coating insulation film 6 as a coating film is formed in this manner. The film thickness HF0 of the coating insulation film 6 at this time can be changed by adjusting the thickness of the silicon oxide film to be deposited. Thus, the construction as shown in FIG. 3 is obtained.

Although the silicon nitride film is used as a mask for forming trench isolation oxide film 2, the trench may be formed by covering the conductive region with a resist pattern, for example, having an etching rate different from that of a silicon substrate and etching semiconductor substrate 1 using the resist pattern as a mask.

The film thickness HF0 of coating insulation film 6 may be at least 50 nm and at most 100 nm. The silicon oxide film for forming coating insulation film 6 may be deposited by the CVD method.

Preferably, the angle $\alpha 0$ between the sidewall of coating insulation film 6 and the main surface of semiconductor substrate 1 is at least 60° and at most 90° by controlling the etching condition for forming coating insulation film 6. Thus, isolation oxide film sidewall 8 (see FIG. 1) can be formed reliably.

Figure 4:
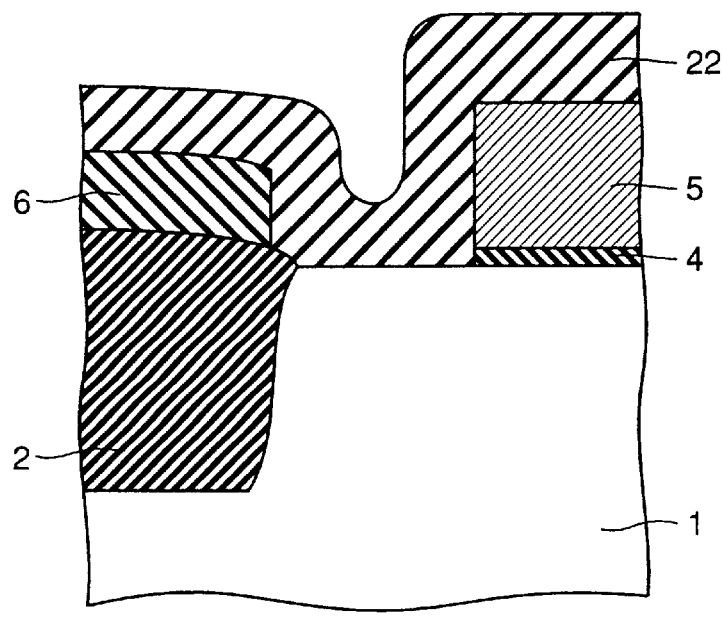

As shown in FIG. 4, a silicon nitride film 22 is then deposited on coating insulation film 6, the main surface of semiconductor substrate 1 and gate electrode 5 such as by the CVD method.

Figure 5:
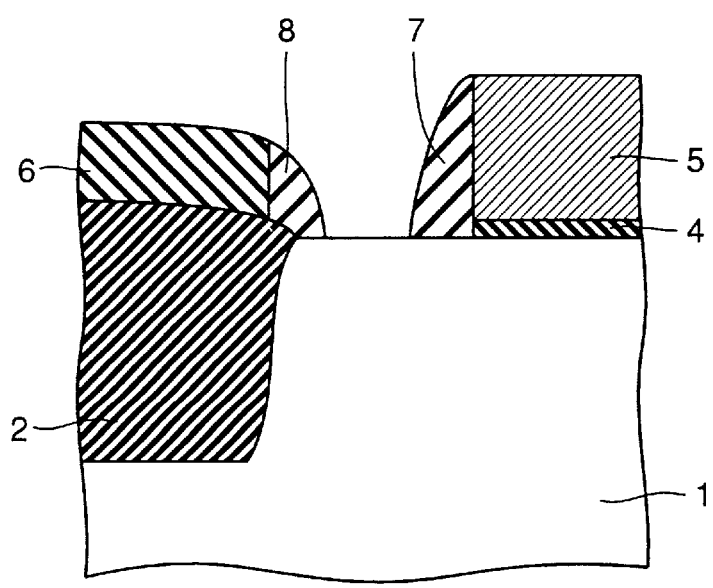

As shown in FIG. 5, isolation oxide film sidewall 8 as a sidewall coating film and gate electrode sidewall 7 can then be formed simultaneously by removing silicon nitride film 22 through anisotropic etching.

Since gate electrode sidewall 7 and isolation oxide film sidewall 8 can be formed in the same step as described above, the number of manufacturing steps of a semiconductor device can be prevented from increasing to form isolation oxide film sidewall 8.

Figure 6:
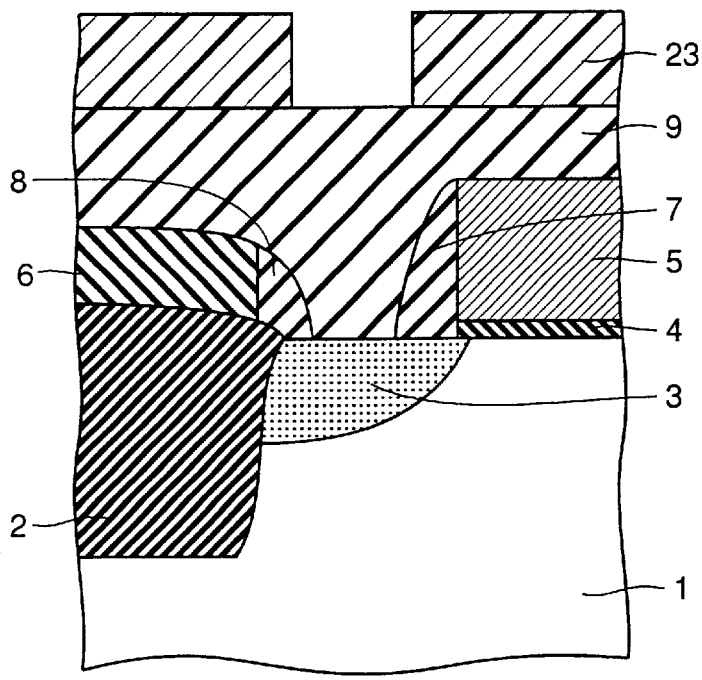

As shown in FIG. 6, source/drain region 3 is formed at the main surface of semiconductor substrate 1 and then first interlayer insulation film 9 is formed on coating insulation film 6 and gate electrode 5. A resist pattern 23 is formed on interlayer insulation film 9.

Figure 7:
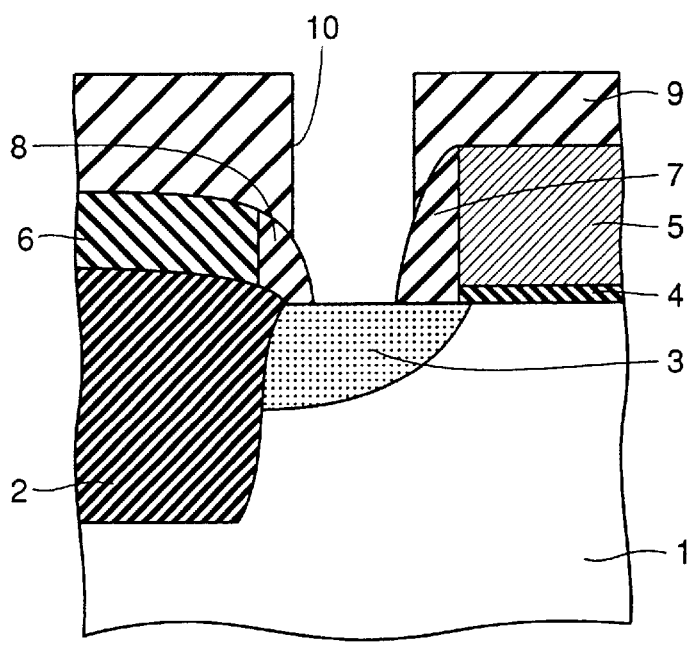

As shown in FIG. 7, part of interlayer insulation film 9 is then removed by etching using resist pattern 23 as a mask to form contact hole 10. Thereafter, resist pattern 23 is removed.

There is isolation oxide film sidewall 8 that is formed of a silicon nitride film having an etching rate different from that of a silicon oxide film for interlayer insulation film 9. Accordingly, partial removal of isolation oxide film 2 by etching can be prevented in the etching step for forming contact hole 10.

Thereafter, interconnection 11 (see FIG. 1) is formed in contact hole 10 and on interlayer insulation film 9 and second interlayer insulation film 12 (see FIG. 1) is formed on interconnection 11. Thus, the semiconductor device as shown in FIG. 1 can be obtained easily.

Figure 8:
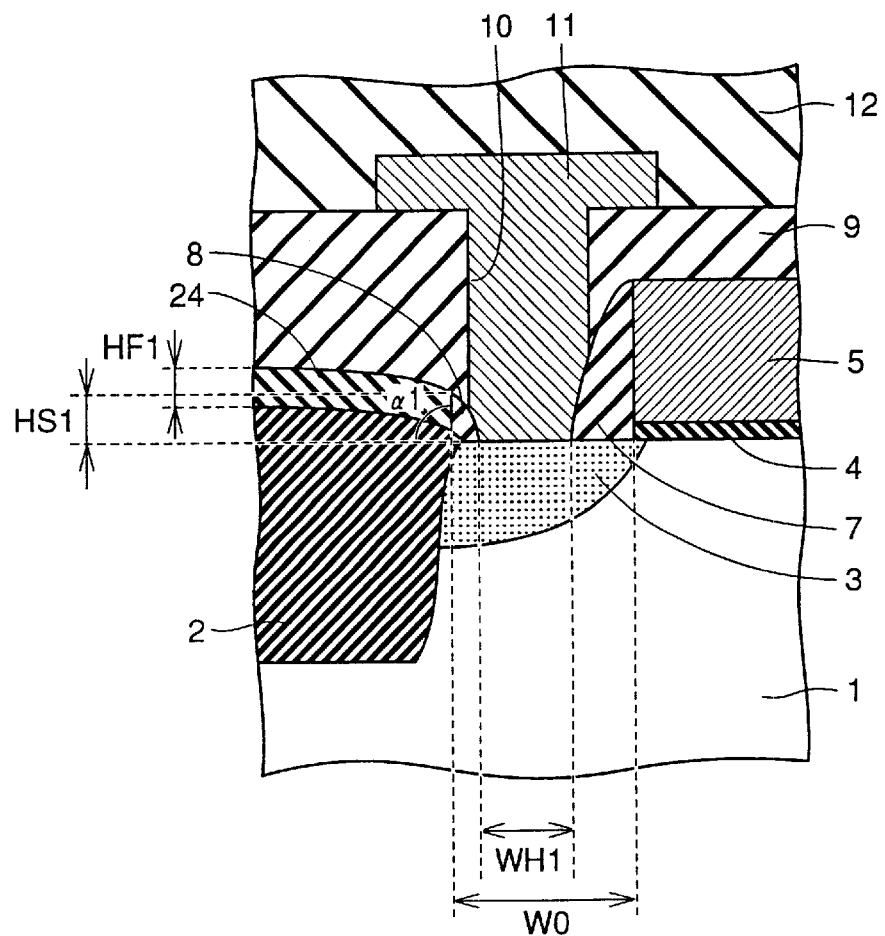
FIG. 8 is a schematic cross sectional view showing a first variation of the semiconductor device in the first embodiment.

Referring to FIG. 8, a semiconductor device will be described.

Referring to FIG. 8, the semiconductor device basically has a similar construction to that of the semiconductor device shown in FIG. 1. In the semiconductor device shown in FIG. 8, however, the film thickness HF1 of a coating insulation film 24 is smaller than the film thickness HF0 of coating insulation film 6 in the semiconductor device shown in FIG. 1.

As a result, the height HS1 from the main surface of semiconductor substrate 1 to the upper surface of coating insulation film 24 at the sidewall portion is smaller than the height HS0 from the main surface of semiconductor substrate 1 to the upper surface of coating insulation film 6 at the sidewall portion in the semiconductor device shown in FIG. 1. Accordingly, the film thickness of isolation oxide film sidewall 8 is smaller than the film thickness of isolation oxide film sidewall 8 in FIG. 1. Thus, the diameter WH1 of the contact plane between interconnection 11 and source/drain region 3 on the bottom surface of contact hole 10 is larger than the diameter WH0 of the contact plane between interconnection 11 and source/drain region 3 in the semiconductor device shown in FIG. 1.

By thus changing the film thickness HF1 of coating insulation film 24, the diameter WH1 of the contact plane between interconnection 11 and source/drain 3 can be changed.

Further, the film thickness of isolation oxide film sidewall 8 can be changed even by changing the angle $\alpha 1$ between the sidewall of coating insulation film 24 and the main surface of semiconductor substrate 1. As a result, the diameter WH1 of the contact plane between interconnection 11 and source/drain region 3 can be changed in a similar manner.

Figure 9:
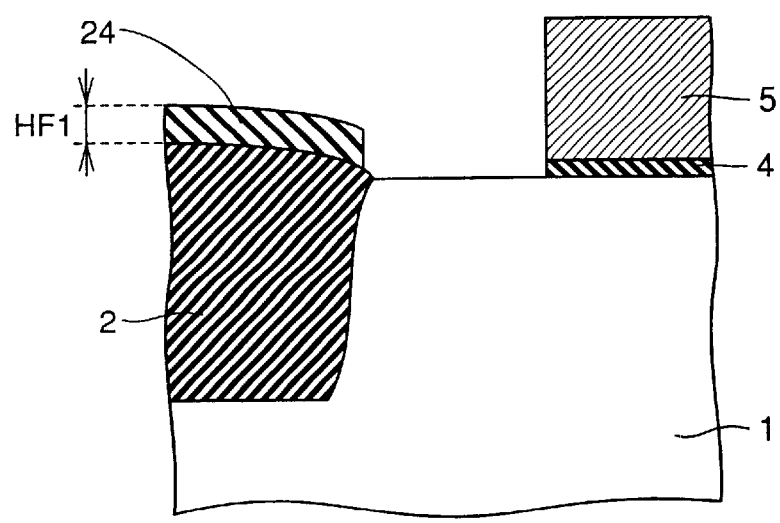
FIG. 9 is a schematic cross sectional view for describing a method of manufacturing the semiconductor device shown in FIG. 8.

Referring to FIG. 9, a method of manufacturing the semiconductor device will be described.

The manufacturing step of the semiconductor device shown in FIG. 9 is basically similar to the one shown in FIG. 3. However, the field thickness HF1 of coating insulation film 24 formed on trench isolation oxide film 2 is smaller than the film thickness HF0 of coating insulation film 6 shown in FIG. 3.

By carrying out the manufacturing steps shown in FIGS. 4 to 7 thereafter, the semiconductor device shown in FIG. 8 can be formed easily.

Figure 10:
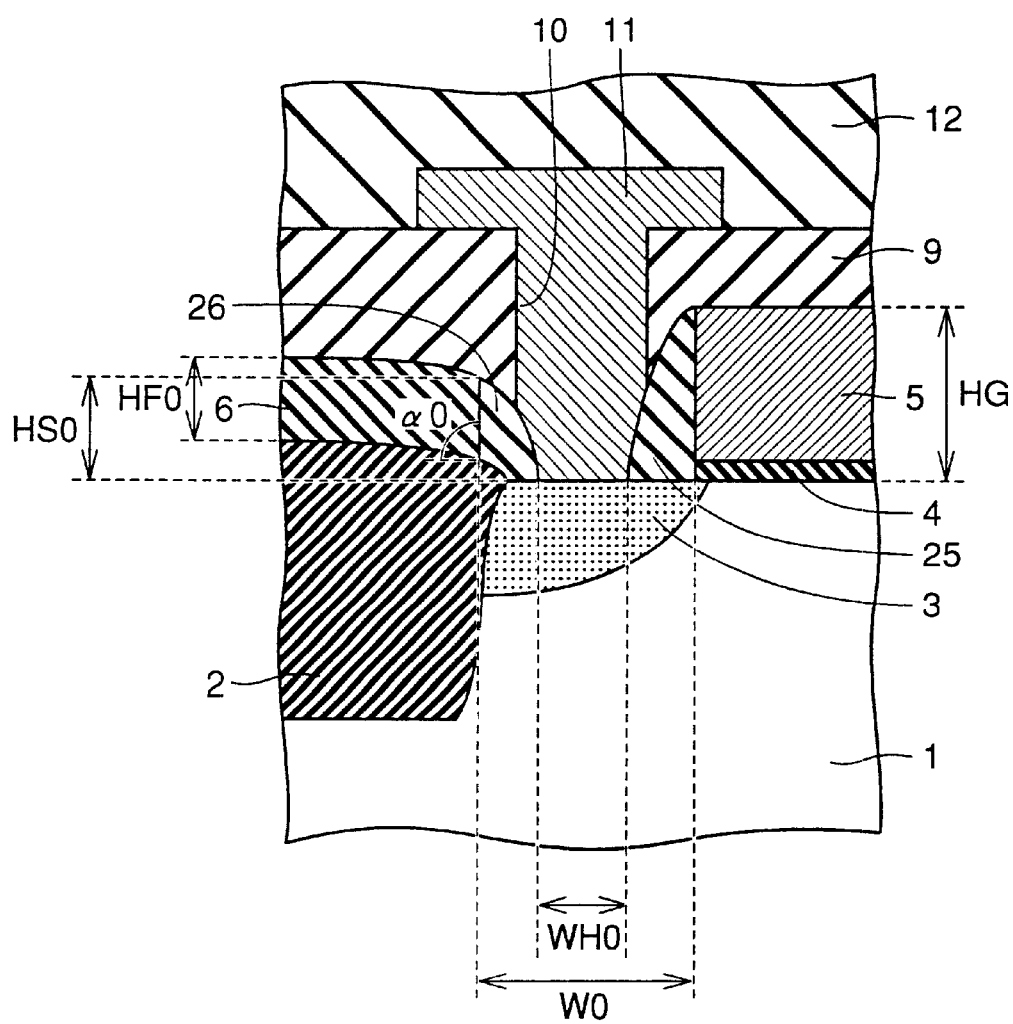
FIGS. 10 and 11 are schematic cross sectional views showing second and third variations of the semiconductor device in the first embodiment.

Referring to FIG. 10, a semiconductor device will be described.

Referring to FIG. 10, the semiconductor device basically has a similar construction to that of the semiconductor device shown in FIG. 1. In the semiconductor device in FIG. 10, however, an isolation oxide film sidewall 26 and a gate electrode sidewall 25 are formed of NSG (non-doped silicate glass). Since the etching rate of the NSG is different from that of a silicon oxide film more than it is from that of a silicon nitride film, damage to trench isolation oxide film 2 by etching can be prevented more reliably in the etching step for forming contact hole 10.

Even if a low pressure TEOS oxide film is used instead of the NSG as isolation oxide film sidewall 26, similar effects can be obtained.

Figure 11:
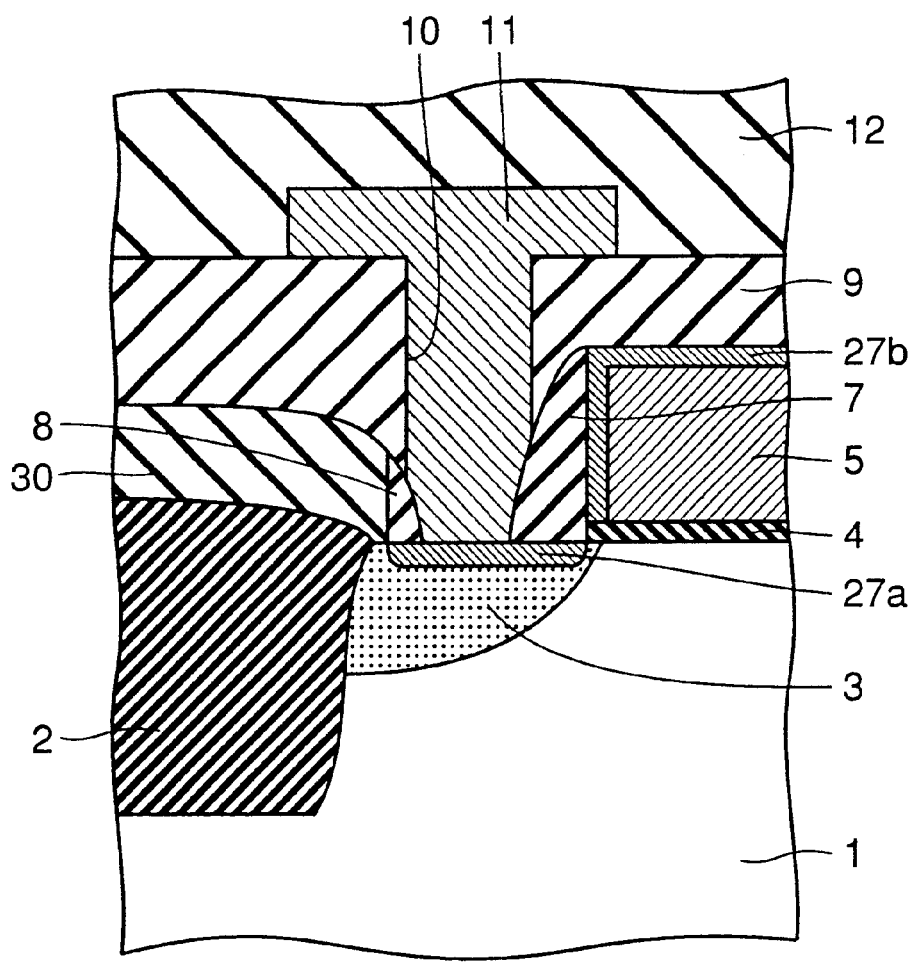

Referring to FIG. 11, a semiconductor device will be described.

Referring to FIG. 11, the semiconductor device basically has a similar construction to that of the semiconductor device shown in FIG. 1. In the semiconductor device shown in FIG. 11, however, cobalt silicide regions 27a, 27b are formed in source/drain region 3 and gate electrode 5. Since such cobalt silicide regions 27a, 27b can reduce the resistance of an impurity diffusion layer, they are used in semiconductor devices such as logic devices requiring higher speed operation.

In this case, a coating insulation film 30 as a coating film can be utilized as a protection film during silicide formation as described in the manufacturing method described below. Since a protection film and coating insulation film 30 do not have to be formed separately, the effects of the semiconductor device as shown in FIG. 1 can be obtained and the number of manufacturing steps of a semiconductor device can be prevented from increasing.

Figure 12:
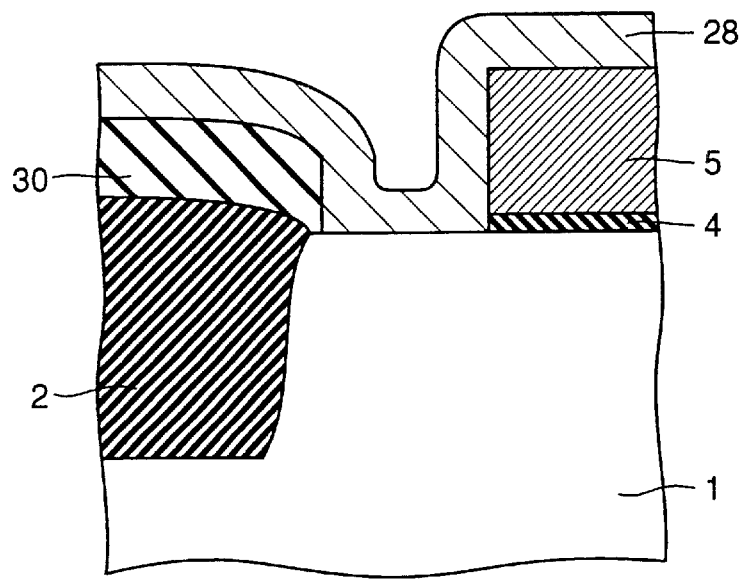
FIGS. 12 and 13 are schematic cross sectional views for describing the first and second steps of a method of manufacturing the semiconductor device shown in FIG. 11.
Figure 13:
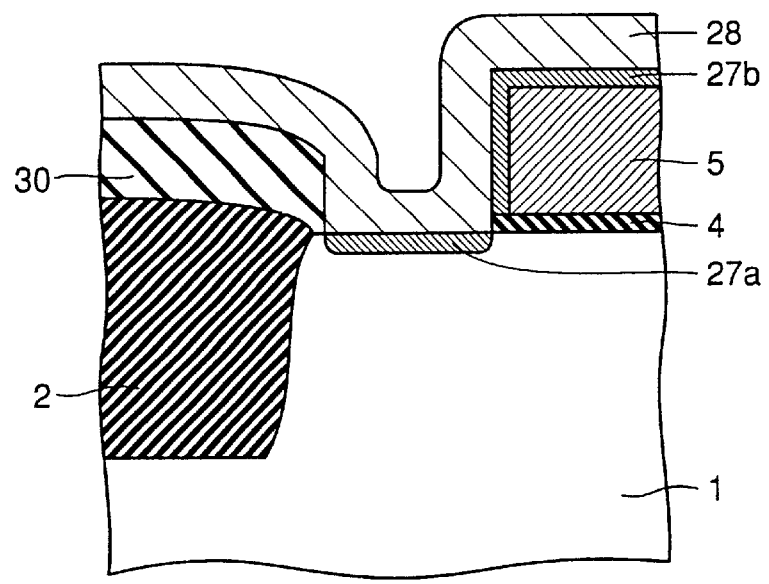

Referring to FIGS. 12 and 13, a method of manufacturing the semiconductor device shown in FIG. 11 will be described.

By a similar step to the manufacturing step of the semiconductor device shown in FIG. 3, trench isolation oxide film 2 (see FIG. 12) is first formed at the main surface of semiconductor substrate 1 (see FIG. 12). Then, gate insulation film 4 (see FIG. 12), gate electrode 5 (see FIG. 12) and coating insulation film 30 (see FIG. 12) are formed in a similar manner. Since coating insulation film 30 here serves as a protection film for preventing silicidation of trench isolation oxide film 2, however, it is formed to cover the entire upper surface of trench isolation oxide film 2. The film thickness of coating insulation film 30 is 50~100 nm. Then, a cobalt film 28 is deposited on coating insulation film 30, the main surface of semiconductor substrate 1 and gate electrode 5. The construction as shown in FIG. 12 is obtained in this manner.

Then, cobalt film 28 is reacted with semiconductor substrate 1 and gate electrode 5 by heating. As a result, cobalt silicide regions 27a, 27b (see FIG. 13) can be formed. Thus, the construction as shown in FIG. 13 is obtained.

Thereafter, cobalt film 28 is removed by etching. Then, the steps shown in FIGS. 4 to 7 are carried out, and the semiconductor device as shown in FIG. 11 can be obtained easily.

Since coating insulation film 30 serves as a protection film for preventing silicidation of trench isolation oxide film 2 during heating, the number of manufacturing steps of a semiconductor device can be reduced compared with a case where such a protection film is formed separately.

Further, by making the film thickness of coating insulation film 30 at least 50 nm and at most 100 nm and the angle between the sidewall of coating insulation film 30 and the main surface of semiconductor substrate 1 at least 60° and at most 90°, isolation oxide film sidewall 8 (see FIG. 11) can be formed easily.

Second Embodiment

Figure 14:
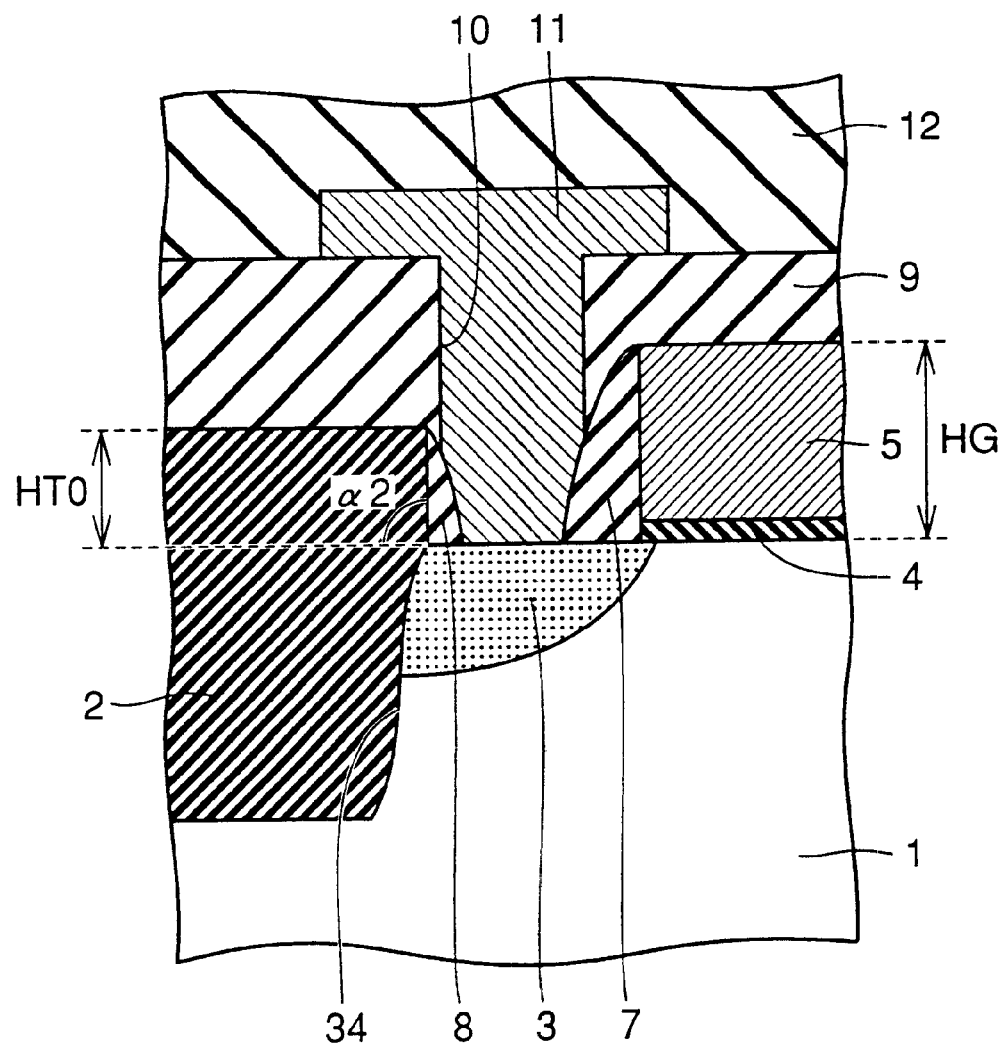
FIG. 14 is a schematic cross sectional view showing a semiconductor device in a second embodiment of the present invention.

Referring to FIG. 14, a semiconductor device will be described.

Referring to FIG. 14, the semiconductor device basically has a similar construction to that of the semiconductor device according to the first embodiment shown in FIG. 1. In FIG. 14, however, trench isolation oxide film 2 has an upper insulator that protrudes from the main surface of semiconductor substrate 1 by the height HT0. Here, the height HT0 is preferably at least 50 nm and at most 100 nm. The angle α2 between the sidewall of the upper insulator and the main surface of semiconductor substrate 1 is at least 60° and at most 90°. Isolation oxide film sidewall 8 as a sidewall coating film is formed on the sidewall of the upper insulator.

Since isolation oxide film sidewall 8 is provided as described above, similar effects to those of the semiconductor device shown in FIG. 1 can be obtained.

Further, the film thickness of isolation oxide film sidewall 8 can be changed by changing the film thickness HT0 of the upper insulator in trench isolation oxide film 2 and the angle α2 between the sidewall of the upper insulator and the main surface of semiconductor substrate 1. As a result, the diameter of the contact plane between interconnection 11 and source/drain region 3 can be changed.

Referring to FIGS. 15 to 18, a method of manufacturing the semiconductor device will be described.

Figure 15:
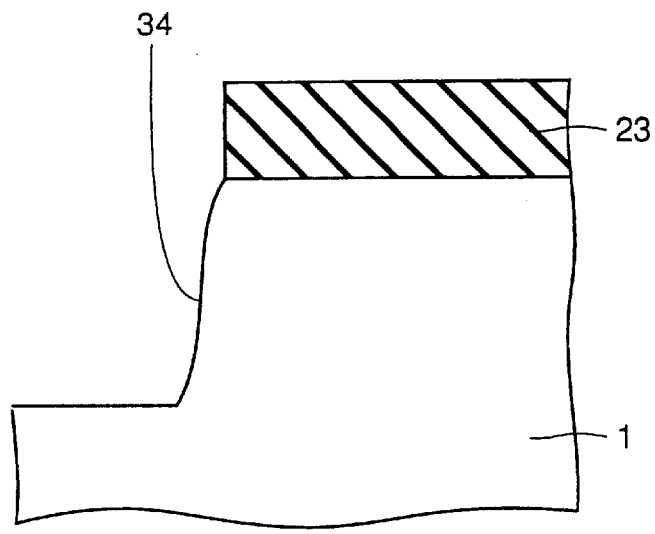
FIGS. 15 to 18 are schematic cross sectional views for describing the first to fourth steps of a method of manufacturing the semiconductor device shown in FIG. 14.

A silicon nitride film (not shown) is first formed on the main surface of semiconductor substrate 1 (see FIG. 15). A resist pattern (not shown) is formed on the silicon nitride film. The silicon nitride film is removed by etching using the resist pattern as a mask. Then, the resist pattern is removed. By removing semiconductor substrate 1 by etching using a silicon nitride film 23 (see FIG. 15) as a mask, a trench 34 (see FIG. 15) is formed. Thus, the construction as shown in FIG. 15 is obtained.

Figure 16:
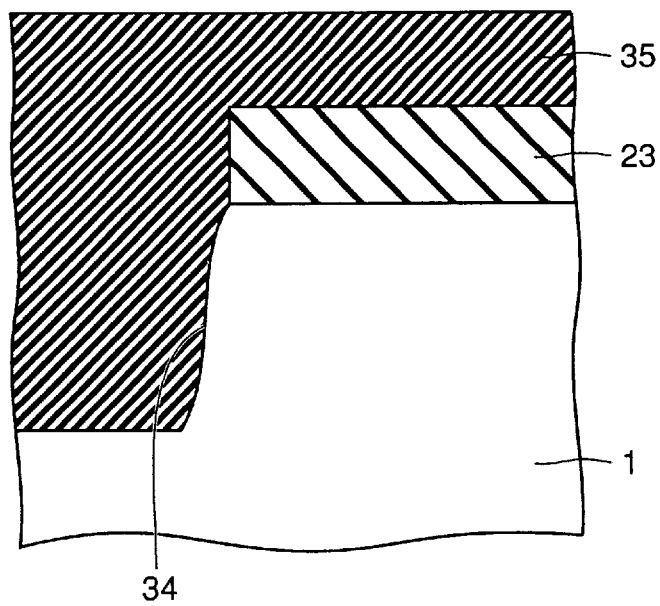

As shown in FIG. 16, a silicon oxide film 35 is then deposited in trench 34 and on silicon nitride film 23.

Figure 17:
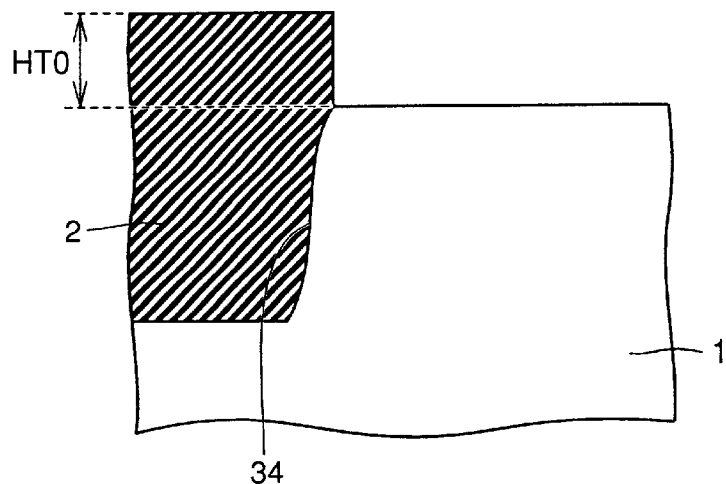

Then, silicon oxide film 35 on silicon nitride film 23 is removed by the CMP method. Thereafter, silicon nitride film 23 is removed by etching. Thus, trench isolation oxide film 2 is formed as shown in FIG. 17.

Here, the film thickness HT0 of the upper insulator in trench isolation oxide film 2 can be changed by changing the film thickness of silicon nitride film 23 (see FIG. 16). The angle α2 between the sidewall of the upper insulator and the main surface of semiconductor substrate 1 can be changed by adjusting the inclination angle of the sidewall of silicon nitride film 23.

Figure 18:
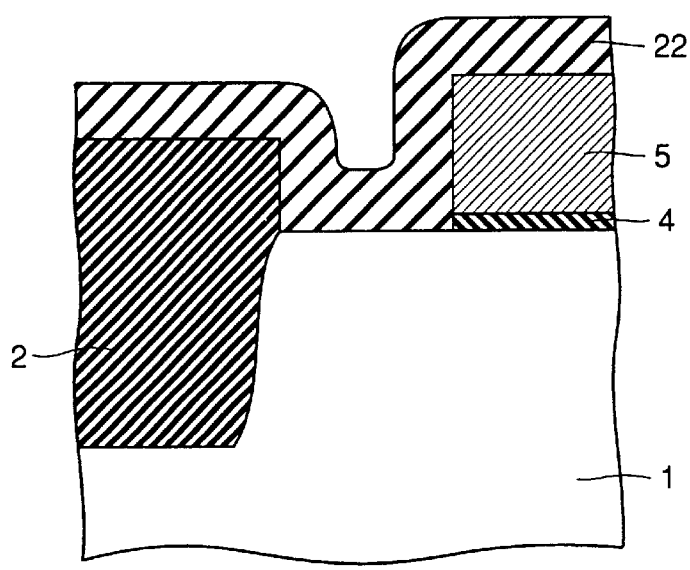

As shown in FIG. 18, gate insulation film 4 and gate electrode 5 are then formed in a conductive region on the main surface of semiconductor substrate 1. Thereafter, silicon nitride film 22 is deposited on trench isolation oxide film 2, the main surface of semiconductor substrate 1 and gate electrode 5 by the CVD method.

By carrying out the manufacturing steps shown in FIGS. 5 to 7 thereafter, isolation oxide film sidewall 8 (see FIG. 14) is formed on the sidewall of trench isolation oxide film 2. At the same time, gate electrode sidewall 7 (see FIG. 14) is formed on the side surface of gate electrode 5. Thus, the semiconductor device as shown in FIG. 14 can be obtained easily.

Since isolation oxide film sidewall 8 and gate electrode sidewall 7 can be formed in the same step as described above, increase in the number of manufacturing steps of a semiconductor device can be prevented even when isolation oxide film sidewall 8 is to be formed.

In the semiconductor device shown in FIG. 14, isolation oxide film sidewall 8 and gate electrode sidewall 7 may be formed of NSG (non-doped silicate glass) or a low pressure TEOS oxide film similarly to the semiconductor device shown in FIG. 10. In this case, similar effects to those of the semiconductor device shown in FIG. 10 can be obtained.

If cobalt silicide regions are formed in source/drain region 3 and gate electrode 5 in the semiconductor device shown in FIG. 14 similarly to the semiconductor device shown in FIG. 11, similar effects to those of the semiconductor device shown in FIG. 10 can be obtained.

Third Embodiment

Figure 19:
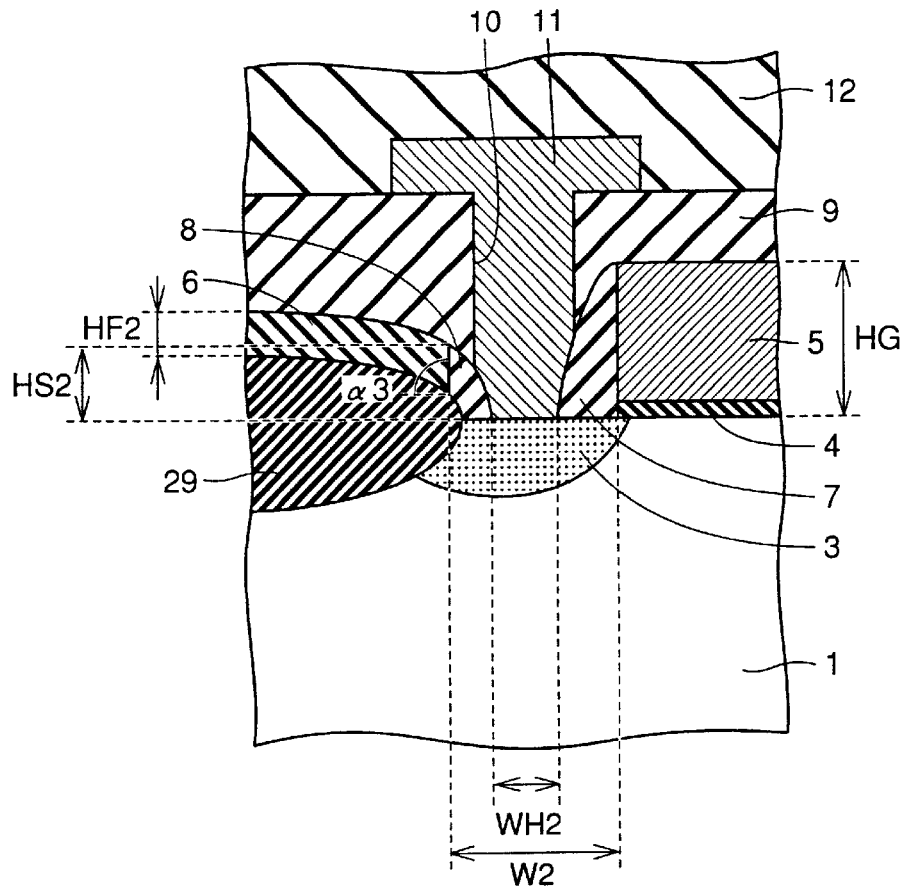
FIG. 19 is a schematic cross sectional view showing a semiconductor device in a third embodiment of the present invention.

Referring to FIG. 19, the semiconductor device basically has a similar construction to that of the semiconductor device according to the first embodiment shown in FIG. 1. In the semiconductor device shown in FIG. 19, however, not a trench isolation oxide film but an LOCOS isolation oxide film 29 is used as an isolation oxide film. Accordingly, even when LOCOS isolation oxide film 29 is used as an isolation oxide film, isolation oxide film sidewall 8 as a sidewall coating film can be formed easily by forming coating insulation film 6 as a coating film. As a result, similar effects to those of the semiconductor device shown in FIG. 1 can be obtained. That is, removal of part of LOCOS isolation oxide film 29 by etching can be prevented during etching for forming contact hole 10, because isolation oxide film sidewall 8 exists. As a result, increase in the junction leakage current can be prevented similarly to the semiconductor device according to the first embodiment.

Further, the height HS2 from the main surface of semiconductor substrate 1 to the upper surface of coating insulation film 6 at the sidewall portion can be changed easily by changing the film thickness HF2 of coating insulation film 6. As a result, the film thickness of isolation oxide film sidewall 8 can be changed.

Further, the film thickness of isolation oxide film sidewall 8 can be changed even by changing the angle α3 between the sidewall of coating insulation film 6 and the main surface of semiconductor substrate 1. As a result, the diameter WH2 of the contact plane between interconnection 11 and source/drain region 3 can be changed by changing the film thickness of isolation oxide film sidewall 8 without changing the distance W2 between gate electrode 5 and coating insulation film 6 and the diameter of contact hole 10 at the upper portion.

Figure 20:
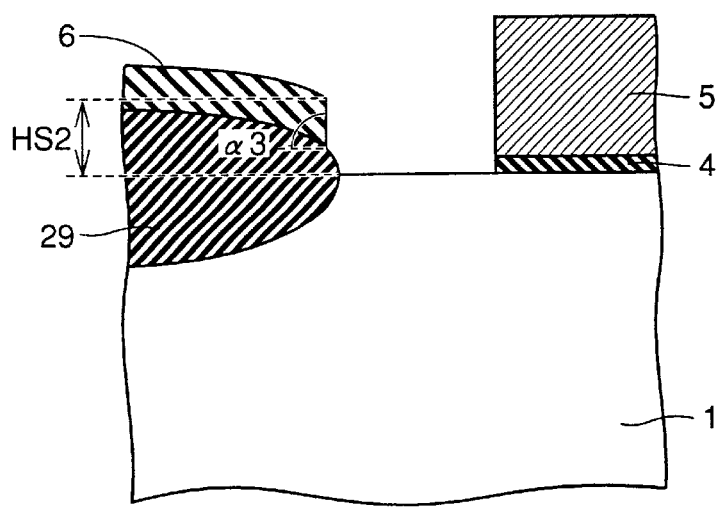
FIG. 20 is a schematic cross sectional view for describing a method of manufacturing the semiconductor device shown in FIG. 19.

Referring to FIG. 20, a method of manufacturing the semiconductor device shown in FIG. 19 will be described.

An antioxidant film such as a silicon nitride film is first formed on the main surface to be a conductive region of semiconductor substrate 1 (see FIG. 20). Then, a region to be LOCOS isolation oxide film 29 (see FIG. 20) is thermally oxidized at a high temperature of at least 1000° to form LOCOS isolation oxide film 29. Thereafter, gate insulation film 4 (see FIG. 20) and gate electrode 5 (see FIG. 20) are formed on the main surface of semiconductor substrate 1 similarly to the manufacturing method of the semiconductor device shown in FIG. 3. Then, coating insulation film 6 is formed on LOCOS isolation oxide film 29 by a similar method to that of the manufacturing method of the semiconductor device shown in FIG. 3.

At this time, the height HS2 from the main surface of semiconductor substrate 1 to the upper surface of coating insulation film 6 at the sidewall portion can be adjusted by adjusting the film thickness of a silicon oxide film (not shown) to be coating insulation film 6.

Further, the angle α3 between the sidewall of coating insulation film 6 and the main surface of semiconductor substrate 1 can be changed by changing the etching condition for forming coating insulation film 6.

Thus, the construction as shown in FIG. 20 can be obtained.

By carrying out the manufacturing method of the semiconductor device shown in FIGS. 4 to 7 thereafter, the semiconductor device as shown in FIG. 19 can be obtained easily.

Figure 21:
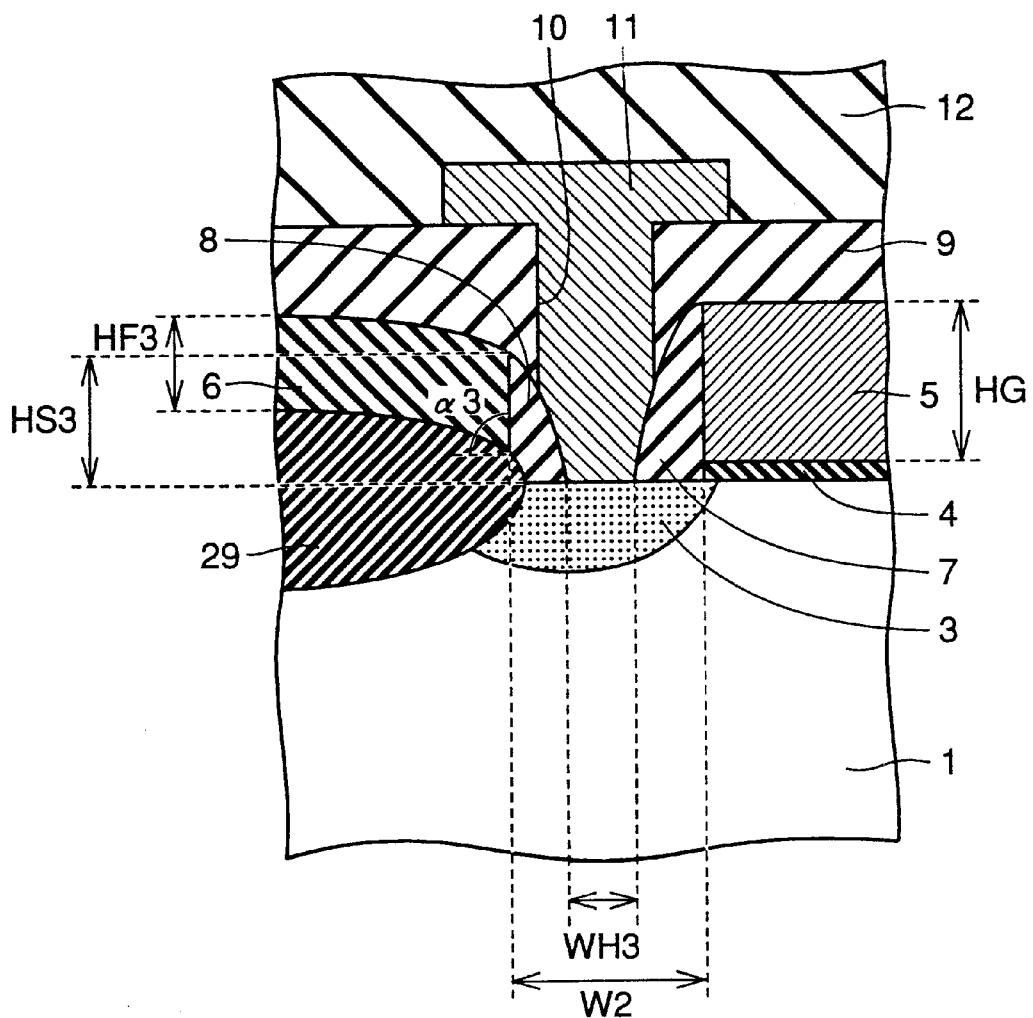
FIGS. 21 and 22 are schematic cross sectional views showing first and second variations of the semiconductor device in the third embodiment.

Referring to FIG. 21, the semiconductor device basically has a similar construction to that of the semiconductor device shown in FIG. 19. In the semiconductor device shown in FIG. 21, however, the film thickness HF3 of coating insulation film 6 is larger than the film thickness HF2 of coating insulation film 6 in the semiconductor device shown in FIG. 19. As a result, the height HS3 from the main surface of semiconductor substrate 1 to the upper surface of coating insulation film 6 at the sidewall portion in the semiconductor device shown in FIG. 21 is larger than the height HS2 from the main surface of semiconductor substrate 1 to the upper surface of coating insulation film 6 at the sidewall portion in the semiconductor device shown in FIG. 19. Accordingly, the film thickness of isolation oxide film sidewall 8 can be made larger than the film thickness of isolation oxide film sidewall 8 in the semiconductor device shown in FIG. 19. Thus, the diameter WH3 of the contact plane between interconnection 11 and source/drain region 3 can be changed to be smaller without changing the distance W2 between gate electrode 5 and coating insulation film 6 and the diameter of contact hole 10 at the upper portion.

Figure 22:
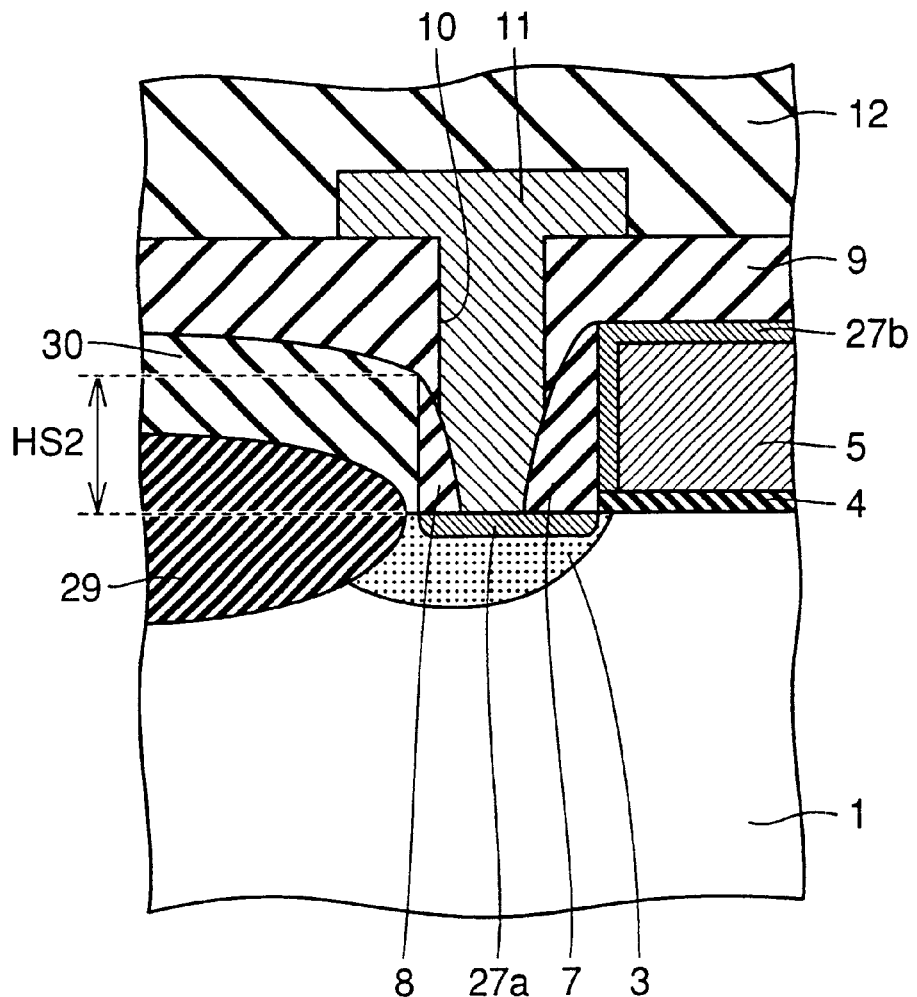

Referring to FIG. 22, the semiconductor device basically has a similar construction to that of the semiconductor device shown in FIG. 19. In the semiconductor device shown in FIG. 22, however, cobalt silicide regions 27a, 27b are formed in source/drain region 3 and gate electrode 5. As a result, similar effects to those of the semiconductor device shown in FIG. 11 can be obtained.

In the semiconductor device shown in FIG. 19, isolation oxide film sidewall 8 and gate electrode sidewall 7 may be formed of NSG (non-doped silicate glass) or a low pressure TEOS oxide film similarly to the semiconductor device shown in FIG. 10. In this case, similar effects to those of the semiconductor device shown in FIG. 10 can be obtained.

Fourth Embodiment

Figure 23:
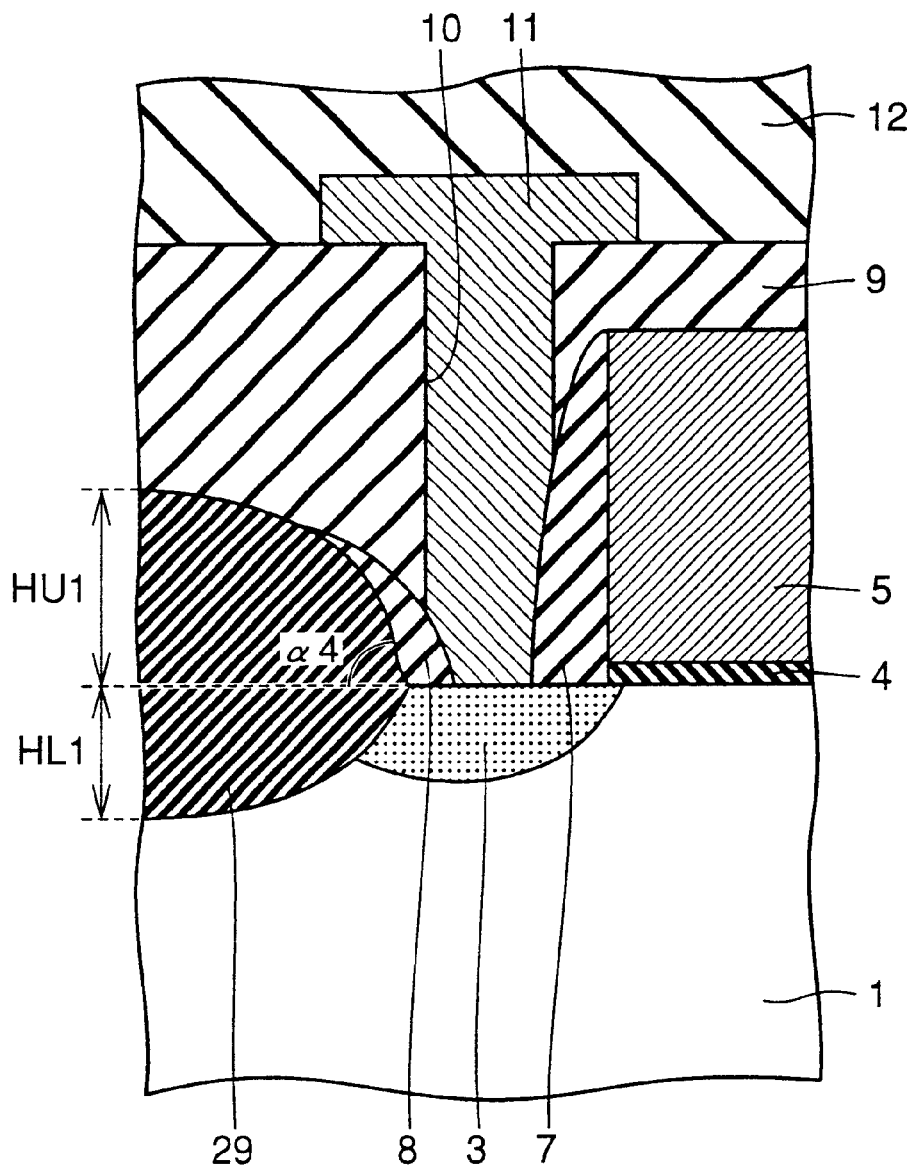
FIG. 23 is a schematic cross sectional view showing a semiconductor device in a fourth embodiment of the present invention.

Referring to FIG. 23, the semiconductor device basically has a similar construction to that of the semiconductor device according to the second embodiment shown in FIG. 14. In the semiconductor device shown in FIG. 23, however, LOCOS isolation oxide film 29 as an isolation insulation film is formed. Isolation oxide film 29 is formed of an upper insulator over the main surface of semiconductor substrate 1 and a lower insulator under the main surface of semiconductor substrate 1, and the film thickness HU1 of the upper insulator is larger than the film thickness HL1 of the lower insulator. Further, the angle α4 between the sidewall of the upper insulator and the main surface of semiconductor substrate 1 is at least 60° and at most 90°. Isolation oxide film sidewall 8 formed of a silicon nitride film as a sidewall coating film is formed on the sidewall of the upper insulator in LOCOS isolation oxide film 29. Accordingly, similar effects to those of the semiconductor device shown in FIG. 1 can be obtained in the semiconductor device shown in FIG. 23 as well.

Since the film thickness HU1 of the upper insulator is larger than the film thickness HL1 of the lower insulator, isolation oxide film sidewall 8 can be formed easily.

Referring to FIGS. 24 to 29, a method of manufacturing the semiconductor device will be described.

Figure 24:
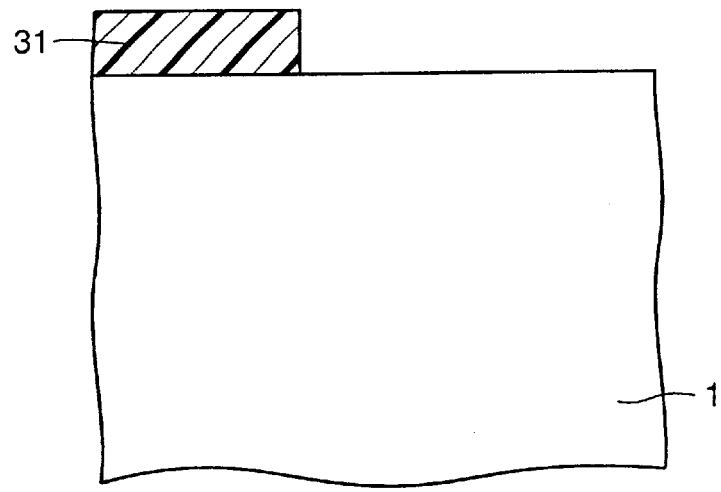
FIGS. 24 to 29 are schematic cross sectional views for describing the first to sixth steps of a method of manufacturing the semiconductor device shown in FIG. 23.

Referring to FIG. 24, a resist pattern 31 is first formed on a region, where LOCOS isolation oxide film 29 (see FIG. 23) is to be formed, of the main surface of semiconductor substrate 1.

Figure 25:
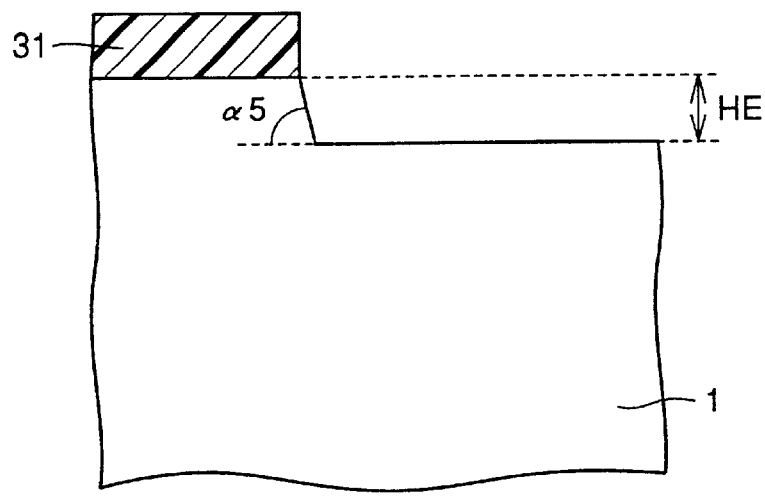

Then, the main surface of semiconductor substrate 1 is removed by the film thickness HE (see FIG. 25) by etching using resist pattern 31 as a mask. The film thickness HE to be removed here is approximately 30~70 nm. Here, by changing the etching condition, the angle $\alpha 5$ between the upper surface of semiconductor substrate 1 and the sidewall of a step portion between the etched region and the protected region by resist pattern 31 can be changed. Thus, the construction as shown in FIG. 25 is obtained.

Thereafter, resist pattern 31 is removed. Although the resist pattern is used as a mask for etching, a material having an etching rate different from that of semiconductor substrate 1, such as a silicon oxide film and a silicon nitride film, can be used as a mask.

Figure 26:
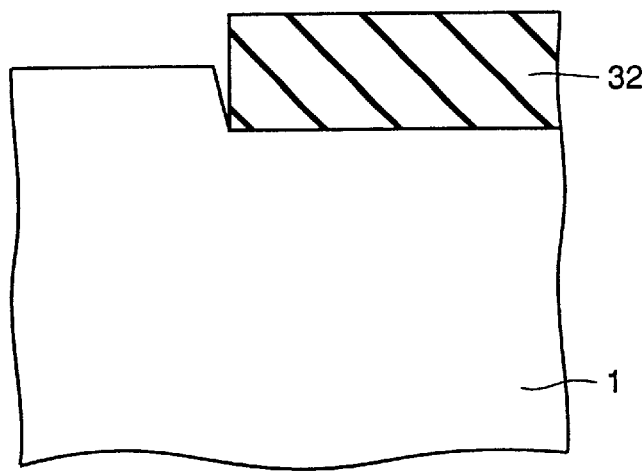

Referring to FIG. 26, a silicon nitride film 32 is then formed on a region, to be a conductive region, of semiconductor substrate 1. By thermally oxidizing the semiconductor substrate at a high temperature of at least 1000° C., LOCOS isolation oxide film 29 is formed as shown in FIG. 27.

Since the main surface of semiconductor substrate 1 where LOCOS isolation oxide film 29 is to be formed is higher than the main surface of semiconductor substrate 1 which is to be a conductive region by HE (see FIG. 25), the film thickness HU1 of the upper insulator in LOCOS isolation oxide film 29 can be made larger than the film thickness HL1 of the lower insulator more reliably.

Figure 27:
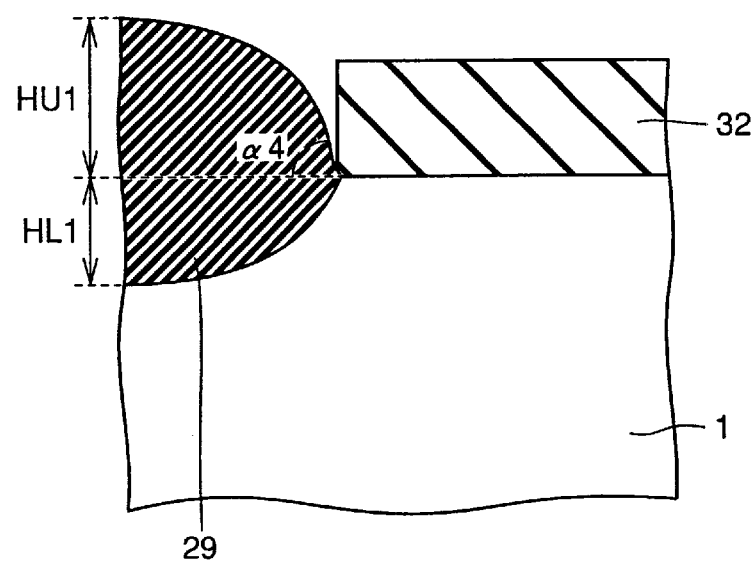

Further, by changing the angle $\alpha 5$ between the main surface of semiconductor substrate 1 and the sidewall of the step portion formed by etching shown in FIG. 25, the angle $\alpha 4$ between the sidewall of the LOCOS isolation oxide film and the main surface of semiconductor substrate 1 can be changed easily as shown in FIG. 27. As a result, the film thickness of isolation oxide film sidewall 8 can be changed similarly to the semiconductor device according to the first embodiment.

Further, by changing the film thickness HE of semiconductor device 1 which is to be removed by etching shown in FIG. 25, the proportion of the film thickness HU1 of the upper insulator and the film thickness HL1 of the lower insulator in the LOCOS isolation oxide film (see FIG. 27) can be changed easily. As a result, LOCOS isolation oxide film 29 of an arbitrary shape can be obtained.

Figure 28:
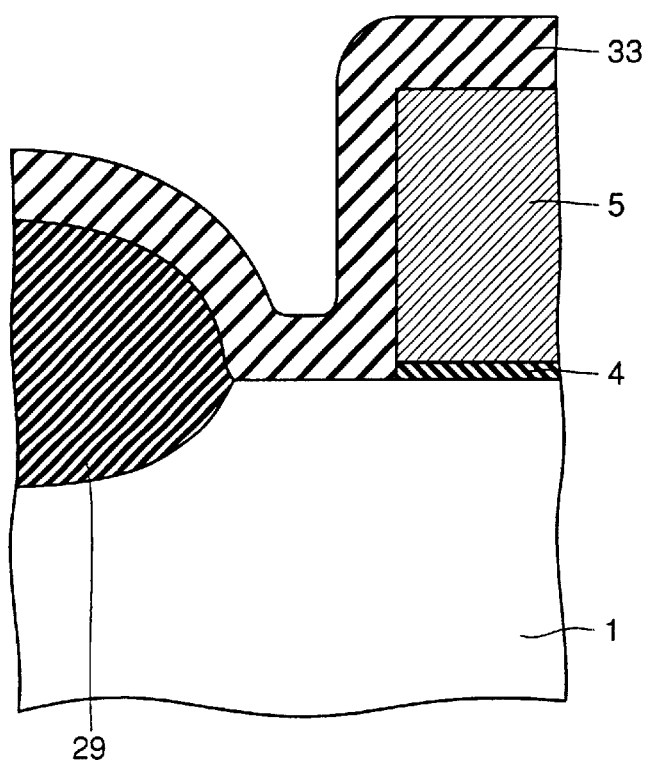

Following the manufacturing steps shown in FIG. 27, silicon nitride film 32 is removed from the main surface of semiconductor substrate 1. Then, gate insulation film 4 (see FIG. 28) and gate electrode 5 (see FIG. 28) are formed on the conductive region of the main surface of semiconductor substrate 1. Thereafter, a silicon nitride film 33 (see FIG. 28) is formed on LOCOS isolation oxide film 29, the main surface of semiconductor substrate 1 and gate electrode 5. Thus, the construction as shown in FIG. 28 is obtained.

Figure 29:
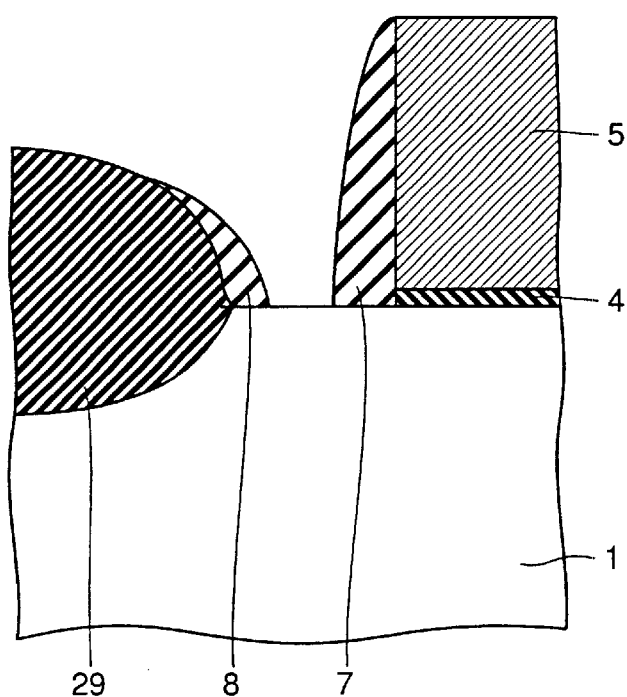

Then, a silicon nitride film 33 is removed by anisotropic etching to simultaneously form isolation oxide film sidewall 8 and gate electrode sidewall 7 as shown in FIG. 29.

Since isolation oxide film sidewall 8 and gate electrode sidewall 7 are formed simultaneously as described above, increase in the number of the manufacturing steps of a semiconductor device can be suppressed even when isolation oxide film sidewall 8 is formed.

Then, by carrying out the manufacturing steps of the semiconductor device as shown in FIGS. 6 and 7, the semiconductor device shown in FIG. 23 can be obtained easily.

Figure 30:
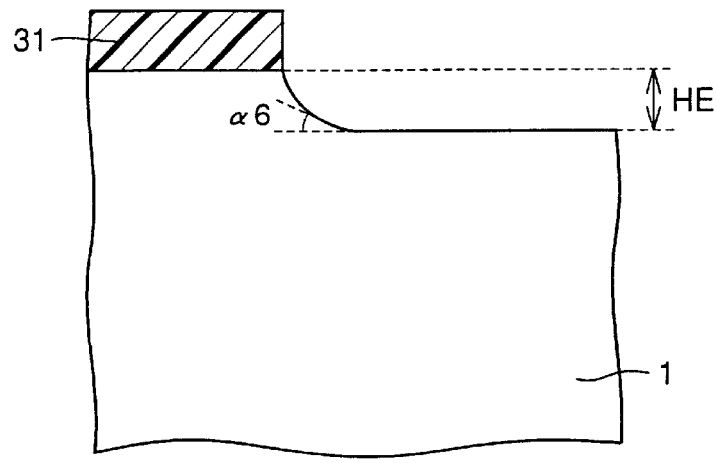
FIG. 30 is a schematic cross sectional view showing a variation of the manufacturing step of the semiconductor device shown in FIG. 25.
Figure 31:
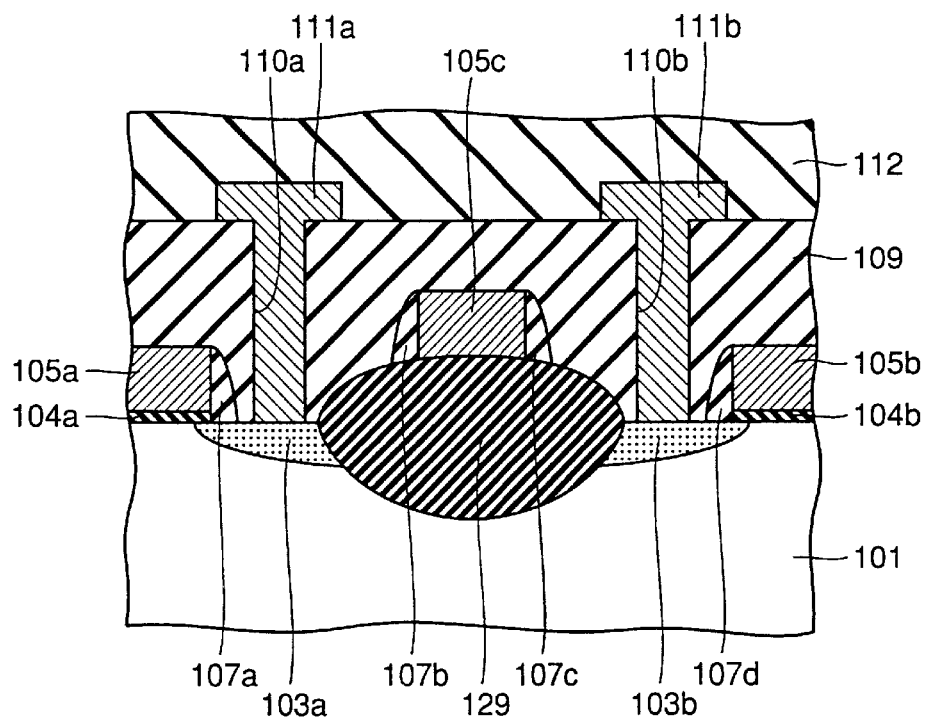
FIG. 31 is a schematic cross sectional view showing a conventional semiconductor device.
Figure 32:
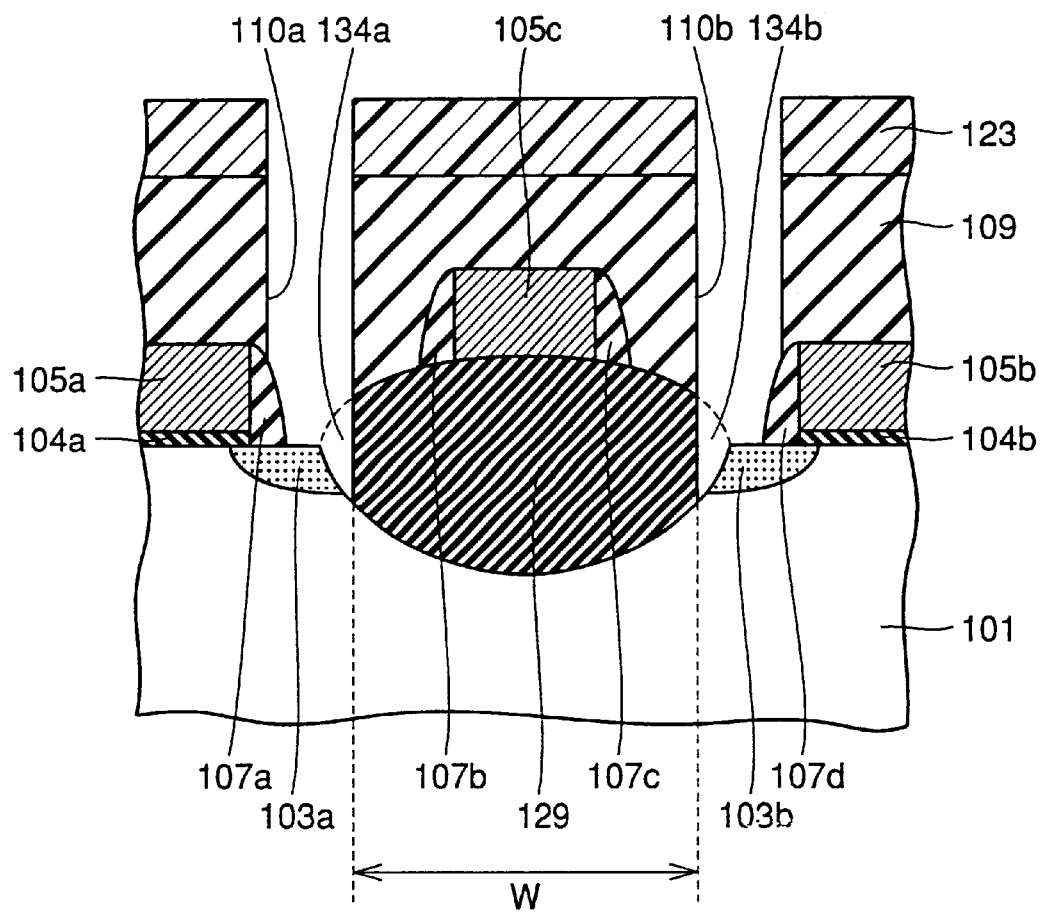
FIG. 32 is a schematic cross sectional view for describing a method of manufacturing the conventional semiconductor device.
Figure 33:
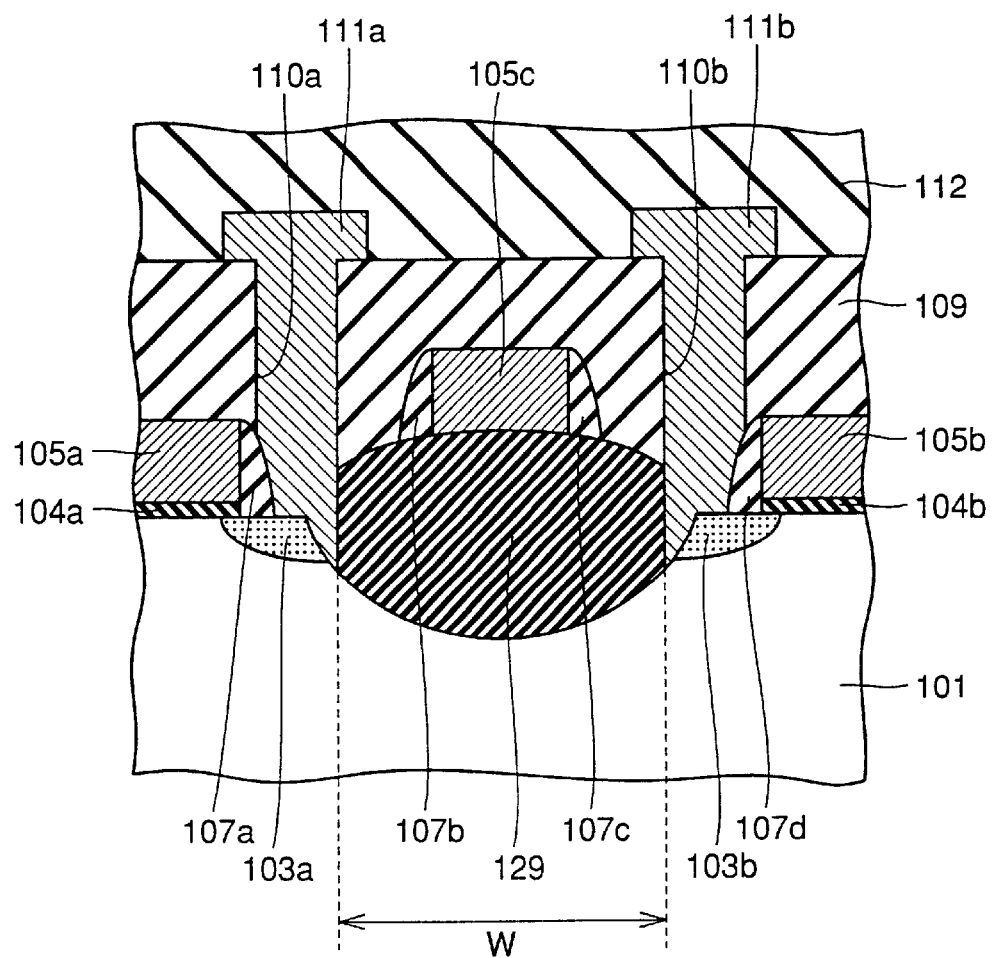
FIG. 33 is a schematic cross sectional view showing a semiconductor device manufactured by the manufacturing method shown in FIG. 32.

If the etching condition is adjusted and more isotropic etching is carried out in the manufacturing step of the semiconductor device shown in FIG. 25, the angle $\alpha 6$ between the main surface of semiconductor device 1 and the sidewall of the step portion between the etched region and the -region masked by resist pattern 31 of semiconductor substrate 1 can be made smaller as shown in FIG. 30. As a result, the angle $\alpha 4$ (see FIG. 23) between the sidewall of LOCOS isolation oxide film 29 and the main surface of semiconductor substrate 1 can be made smaller.

By thus changing the angle $\alpha 6$ between the sidewall of the step portion and the main surface of semiconductor substrate 1, the angle $\alpha 4$ between the side sidewall of LOCOS isolation oxide film 29 and the main surface of semiconductor substrate 1 can be changed arbitrarily.

In the semiconductor device shown in FIG. 23, isolation oxide film sidewall 8 and gate electrode sidewall 7 may be formed of NSG (non-doped silicate glass) or a low pressure TEOS oxide film similarly to the semiconductor device as shown in FIG. 10. In this case, similar effects to those of the semiconductor device as shown in FIG. 10 can be obtained.

If cobalt silicide regions are formed in source/drain region 3 and gate electrode 5 in the semiconductor device shown in FIG. 23 similarly to the semiconductor device shown in FIG. 11, similar effects to those of the semiconductor device as shown in FIG. 10 can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate having a main surface;
   an isolation insulator formed at the main surface of said semiconductor substrate, wherein said isolation insulator isolates a conductive region formed in the main surface of the semiconductor substrate;
   a gate electrode formed in said conductive region;
   a coating film formed on said isolation insulator and having a sidewall and a film thickness of at most that of said gate electrode, wherein the thickness of the gate electrode and the coating film are measured in a direction substantially perpendicular to the main surface of the semiconductor substrate, and the thickness of the coating film is measured at a portion of the coating film that contacts the isolation insulator, and the sidewall of said coating film is inclined relative to the main surface of said semiconductor substrate;
   a sidewall coating film formed on the sidewall of said coating film; and
   an interlayer insulation film formed directly on said coating film and said sidewall coating film, wherein the sidewall coating film has an etching rate different from that of said interlayer insulation film.

2. The semiconductor device according to claim 1, wherein
   said isolation insulator includes an insulation film that is filled in a trench formed at the main surface of said semiconductor substrate.

3. The semiconductor device according to claim 2, wherein
   said conductive region includes a silicide layer.

4. The semiconductor device according to claim 1, wherein said isolation insulator includes an oxide film that is formed by thermally oxidizing the main surface of said semiconductor substrate.

5. The semiconductor device according to claim 4, wherein
said conductive region includes a silicide layer.

6. The semiconductor device according to claim 1, wherein
said sidewall coating film includes a silicon nitride film.

7. The semiconductor device according to claim 1, wherein
said sidewall coating film includes non-doped silicate glass.

8. The semiconductor device according to claim 1, wherein
said sidewall coating film includes a low pressure TEOS oxide film.

9. The semiconductor device according to claim 1, wherein
said conductive region includes a silicide layer.

10. A semiconductor device, comprising:
a semiconductor substrate having a main surface;
an isolation insulator formed at the main surface of said semiconductor substrate, having a sidewall and insulating a conductive region;
a sidewall coating film formed on the sidewall of said isolation insulator; and
an interlayer insulation film formed directly on said isolation insulator and the sidewall coating film, wherein the sidewall coating film has an etching rate different from that of said interlayer insulation film,
said isolation insulator including
an upper insulator placed over the main surface of said semiconductor substrate and having said sidewall, wherein the sidewall of said upper insulator is inclined relative to the main surface of said semiconductor substrate,
a lower insulator connecting to said upper insulator and placed under the main surface of said semiconductor substrate, and
an upper insulator having its film thickness of at least that of said lower insulator.

11. The semiconductor device according to claim 10, wherein
said sidewall coating film includes a silicon nitride film.

12. The semiconductor device according to claim 10, wherein
said sidewall coating film includes non-doped silicate glass.

13. The semiconductor device according to claim 10, wherein
said sidewall coating film includes a low pressure TEOS oxide film.

14. A semiconductor device, comprising:
a semiconductor substrate having a main surface;
an isolation insulator formed at the main surface of said semiconductor substrate, having a sidewall and isolating a conductive region;
a sidewall coating film formed on the sidewall of said isolation insulator; and
an interlayer insulation film formed immediately above said isolation insulator and said sidewall coating film, wherein the sidewall coating film has an etching rate different from that of said interlayer insulation film,
said isolation insulator including an insulation film that is filled in a trench formed at the main surface of said semiconductor substrate and an upper insulator placed over the main surface of said semiconductor substrate and having said sidewall, wherein the sidewall of said upper insulator is inclined relative to the main surface of said semiconductor substrate,
a lower insulator connecting to said upper insulator and placed under the main surface of said semiconductor substrate.

* * * * *